(12) United States Patent
Gotoh et al.

(10) Patent No.: US 8,350,303 B2
(45) Date of Patent: Jan. 8, 2013

(54) DISPLAY DEVICE AND SPUTTERING TARGET FOR PRODUCING THE SAME

(75) Inventors: Hiroshi Gotoh, Kobe (JP); Toshihiro Kugimiya, Kobe (JP); Katsufumi Tomihisa, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 13/286,284

(22) Filed: Nov. 1, 2011

(65) Prior Publication Data
US 2012/0091591 A1  Apr. 19, 2012

Related U.S. Application Data

(60) Division of application No. 12/349,562, filed on Jan. 7, 2009, now Pat. No. 8,088,259, which is a continuation of application No. 11/349,520, filed on Feb. 8, 2006, now Pat. No. 7,622,809.

(30) Foreign Application Priority Data

Feb. 17, 2005 (JP) .................. 2005-040787
Nov. 29, 2005 (JP) .................. 2005-344679

(51) Int. Cl.
*H01L 27/085* (2006.01)

(52) U.S. Cl. ...................... 257/265; 257/771

(58) Field of Classification Search .......... 257/771, 257/765, 750; 349/139, 140, 42
See application file for complete search history.

(56) References Cited

U.S. PATENT DOCUMENTS

| 4,941,032 | A |   | 7/1990 | Kobayashi et al. |
|---|---|---|---|---|
| 5,193,021 | A |   | 3/1993 | Kim |
| 5,504,601 | A |   | 4/1996 | Watanabe et al. |
| 5,514,909 | A | * | 5/1996 | Yamamoto et al. ........... 257/765 |
| 5,541,007 | A |   | 7/1996 | Ueda et al. |
| 6,033,542 | A | * | 3/2000 | Yamamoto et al. ...... 204/298.13 |
| 6,096,438 | A |   | 8/2000 | Takagi et al. |

(Continued)

FOREIGN PATENT DOCUMENTS

CN        1508615        6/2004

(Continued)

OTHER PUBLICATIONS

Office Action issued Mar. 13, 2011 in Chinese Patent Application No. 10-2008-0085114.

(Continued)

*Primary Examiner* — S. V. Clark
(74) *Attorney, Agent, or Firm* — Oblon, Spivak, McClelland, Maier & Neustadt, L.L.P.

(57) ABSTRACT

A display device in which an Al alloy film and a conductive oxide film are directly connected without interposition of refractory metal and some or all of Al alloy components deposit or are concentrated at the interface of contact between the Al alloy film and the conductive oxide film. The Al alloy film contains 0.1 to 6 at % of at least one element selected from the group consisting of Ni, Ag, Zn, Cu and Ge, and further contains 1) 0.1 to 2 at % of at least one element selected from the group consisting of Mg, Cr, Mn, Ru, Rh, Pd, Ir, Pt, La, Ce, Pr, Gd, Tb, Sm, Eu, Ho, Er, Tm, Yb, Lu and Dy or 2) 0.1 to 1 at % of at least one element selected from the group consisting of Ti, V, Zr, Nb, Mo, Hf, Ta and W, as the alloy components.

12 Claims, 7 Drawing Sheets

U.S. PATENT DOCUMENTS

| | | | |
|---|---|---|---|
| 6,218,206 B1 | 4/2001 | Inoue et al. | |
| 6,252,247 B1 | 6/2001 | Sakata et al. | |
| 6,337,520 B1 | 1/2002 | Jeong et al. | |
| 7,098,539 B2 | 8/2006 | Gotoh et al. | |
| 7,154,180 B2 | 12/2006 | Gotoh et al. | |
| 7,166,921 B2 | 1/2007 | Murata | |
| 7,411,298 B2 | 8/2008 | Kawakami et al. | |
| 7,622,809 B2 | 11/2009 | Gotoh et al. | |
| 7,683,370 B2 | 3/2010 | Kugimiya et al. | |
| 7,943,933 B2 | 5/2011 | Hino et al. | |
| 8,044,399 B2 | 10/2011 | Hino et al. | |
| 8,053,083 B2 | 11/2011 | Gotou et al. | |
| 8,088,259 B2 | 1/2012 | Gotoh et al. | |
| 2002/0050599 A1 | 5/2002 | Lee et al. | |
| 2003/0047812 A1* | 3/2003 | Hagihara et al. | 257/771 |
| 2004/0022664 A1* | 2/2004 | Kubota et al. | 420/550 |
| 2004/0114074 A1 | 6/2004 | Yamamoto | |
| 2004/0126608 A1 | 7/2004 | Gotoh et al. | |
| 2004/0140197 A1 | 7/2004 | Watanabe et al. | |
| 2005/0184395 A1 | 8/2005 | Gotoh et al. | |
| 2005/0224795 A1 | 10/2005 | Gotoh et al. | |
| 2006/0007366 A1 | 1/2006 | Gotoh et al. | |
| 2006/0237849 A1 | 10/2006 | Gotoh et al. | |
| 2006/0275618 A1 | 12/2006 | Kugimiya et al. | |
| 2007/0278497 A1* | 12/2007 | Kawakami et al. | 257/79 |
| 2008/0081532 A1 | 4/2008 | Okuno | |
| 2008/0121522 A1 | 5/2008 | Ehira et al. | |
| 2008/0223718 A1 | 9/2008 | Takagi et al. | |
| 2009/0001373 A1 | 1/2009 | Ochi et al. | |
| 2009/0011261 A1 | 1/2009 | Gotou | |
| 2009/0026072 A1 | 1/2009 | Takagi et al. | |
| 2009/0133784 A1 | 5/2009 | Kugimiya et al. | |
| 2010/0032186 A1 | 2/2010 | Gotou et al. | |
| 2010/0065847 A1 | 3/2010 | Gotou et al. | |
| 2010/0202280 A1 | 8/2010 | Nakai et al. | |
| 2010/0231116 A1 | 9/2010 | Ochi et al. | |
| 2011/0008640 A1 | 1/2011 | Goto et al. | |
| 2011/0121297 A1 | 5/2011 | Kawakami et al. | |
| 2011/0147753 A1 | 6/2011 | Onishi et al. | |

FOREIGN PATENT DOCUMENTS

| | | |
|---|---|---|
| JP | 62-240739 | 10/1987 |
| JP | 7-45555 A | 2/1995 |
| JP | 7-90552 A | 4/1995 |
| JP | 8-306693 A | 11/1996 |
| JP | 9-241834 | 9/1997 |
| JP | 10-183337 | 7/1998 |
| JP | 11-283934 | 10/1999 |
| JP | 11-284195 | 10/1999 |
| JP | 11-337976 | 12/1999 |
| JP | 2000-235961 A | 8/2000 |
| JP | 2003-131252 | 5/2003 |
| JP | 2004-191500 | 7/2004 |
| JP | 2004-204284 | 7/2004 |
| JP | 2004-214606 | 7/2004 |
| KR | 1020010097215 | 11/2001 |
| KR | 10-2002-0089982 | 11/2002 |
| KR | 100471770 | 2/2005 |

OTHER PUBLICATIONS

Japanese Office Action issued Mar. 27, 2012 in Patent Application No. 2008-018783 with English Translation.

Office Action issued Aug. 3, 2012, in Singapore Patent Application No. 201004073-1.

* cited by examiner

DISPLAY DEVICE AND SPUTTERING TARGET FOR PRODUCING THE SAME

This is a divisional application of U.S. application Ser. No. 12/349,562, filed Jan. 7, 2009, which is a continuation application of U.S. application Ser. No. 11/349,520, filed Feb. 8, 2006.

BACKGROUND OF THE INVENTION

1. Field of the Invention

The present invention relates to a display device shaped like a thin film and a sputtering target for producing the same, and more particularly, to a novel display device including an oxide conductive film and an Al alloy film and for use in semiconductor devices, flat panel displays of the active and the passive matrix types such as liquid crystal displays, reflection films, optical components and the like and to a sputtering target for producing the same.

2. Description of the Related Art

Thin film transistors (TFTs) serve as switching elements in a liquid crystal display of the active matrix type for instance, and the liquid crystal display has a TFT array substrate including pixel electrodes and interconnection portions such as scanning lines and signal lines, an opposed substrate which includes a common electrode and is disposed over a predetermined distance facing the TFT array substrate, and a liquid crystal layer which is injected between the TFT array substrate and the opposed substrate. A liquid crystal display of the passive matrix type includes interconnection portions such as scanning lines and signal lines, an opposed substrate which includes a common electrode and is disposed over a predetermined distance facing this interconnection substrate, and a liquid crystal layer which is injected between the interconnection substrate and the opposed substrate. The pixel electrodes may be made of an oxide conductive film such as an indium tin oxide (ITO) film which is obtained by mixing about 10 mass % of tin oxide (SnO) in indium oxide ($In_2O_3$).

While pure Al or Al alloy such as Al—Nd is used for the signal lines of the interconnection portions electrically connected with the pixel electrode of such a conductive oxide film (hereinafter also referred as "pixel electrodes"), a multi-layer film made of refractory metal, such as Mo, Cr, Ti and W, is interposed as barrier metal between the signal lines and the pixel electrodes so that the signal lines will not directly contact the pixel electrodes. However, the recent years have seen an attempt for omission of such refractory metal and direct connection of the pixel electrodes with the signal lines.

According to Patent Document 1 (JP, 11-337976, A) for instance, use of pixel electrode of an IZO film obtained by mixing about 10 mass %, of zinc oxide in indium oxide realizes direct contact with signal lines.

Patent Document 2 (JP, 11-283934, A) describes a surface treatment method by means of plasma processing, ion implantation or the like of a drain electrode, while Patent Document 3 (JP, 11-284195, A) describes a method of forming, as a gate, a source and a drain electrodes of a first layer, a multi-layer film in which a second phase containing impurities such as N, O, Si, C or the like is stacked. Where these methods are used, clearly, it is possible to maintain the contact resistance with pixel electrodes at a low level even when such refractory metal as that described above is omitted.

The reason of interposing barrier metal according to these conventional techniques is because direct contact between interconnections of Al or Al alloy forming signal lines and pixel electrodes increases the contact resistance and degrades the quality of a displayed image. This is because Al easily gets oxidized and its surface gets oxidized in the atmosphere, and because pixel electrodes which are metal oxides seat in their surfaces a high-resistance Al oxide layer as Al is oxidized by oxygen which is created or added during film deposition. Forming of the insulation layer at the interface of contact between the signal lines and the pixel electrodes increases the contact resistance between the signal lines and the pixel electrodes and deteriorates the quality of a displayed image.

Meanwhile, although barrier metal has a function of preventing oxidation of the surface of Al alloy and keeping an Al alloy film and a pixel electrode in favorable contact, since a barrier metal forming step is indispensable to fabrication of a conventional structure in which barrier metal is interposed at this contact interface, it is necessary to secure a film deposition chamber for forming barrier metal in addition to a film deposition sputtering apparatus for forming a gate electrode, a source electrode and further a drain electrode. Nevertheless, as mass production of liquid crystal panels has realized a low cost, an increase of the manufacturing cost and a drop in productivity due to creation of barrier metal are becoming significant.

Against this background, an electrode material, a manufacturing process and the like for omission of barrier metal are recently demanded. In response, Patent Document 2 proposes addition of one surface treatment step. Meanwhile, permitting continuous film deposition of a gate electrode, a source electrode or a drain electrode within the same film deposition chamber, Patent Document 3 inevitably demands more processing steps. Further, due to different coefficients of thermal expansion between a film which contains impurities and a film which is free from impurities, the phenomenon that a film falls off from a wall surface of the chamber during continuous use is rampant, and therefore, it is necessary to often stop an apparatus for the purpose of maintenance. In addition, since Patent Document 1 requires changing an indium tin oxide (ITO) film which is currently most popular to an indium zinc oxide (IZO) film, the material cost is expensive.

Noting this, the inventors developed the technique described in Patent Document 4 (JP, 2004-214606, A) as a result of extensive research and study in an attempt to establish such a technique with which it is possible to simplify processing steps while omitting such barrier metal as that described above without increasing the number of the processing steps and with which it is possible to obtain excellent electrical characteristics and heat resisting property which realize a low contact resistance at a low electrical resistivity without fail and achieve standardization of the material with a reflection electrode, a TAB connection electrode and the like in a display device.

This technique is an attempt to solve the problem described above by using, as the material of an Al alloy film, Al alloy which contains 0.1 through 6 at of of at least one element selected from group of Au, Ag, Zn, Cu, Ni, Sr, Sm, Ge and Bi and making a part of these alloy components appear as a deposit or concentrated layer at the contact interface mentioned above, and it has been confirmed that among these elements, Al alloy containing a predetermined amount of Ni exhibits excellent capabilities.

By the way, a process temperature for producing a display device recently tends to become low for a better yield and an improved productivity, and for further, there are ongoing endeavors to use a resin having a low heat resisting temperature as a base material. Hence, while a demand for a heat resisting temperature is not very strong, there is a significant demand for an interconnection material having a low electrical resistivity.

The material of source and drain electrodes of amorphous silicon TFTs, one type of display device elements, for instance is required to have a low electrical resistivity and a heat resisting property, and demanded specifications are for example an electrical resistivity of 8 μΩ·cm or lower and a heat resisting temperature of about 350 degrees Celsius. This heat resisting temperature is determined by a maximum temperature applied upon the source and drain electrodes during producing, and this maximum temperature is a temperature of forming an insulation film which is to be formed as a protection film on the electrodes.

It has become possible to obtain a desired insulation film even at a low temperature owing to advanced film deposition techniques, and it is becoming possible to form a protection film in particular on source and drain electrodes at about 250 degrees Celsius. This gives rise to a demand for an interconnection material whose heat resisting temperature is approximately 250 degrees Celsius and whose electrical resistivity is sufficiently low.

Meanwhile, although an Al alloy film generally used from before as an interconnection material for a display device is formed by sputtering, in the case of an Al alloy film formed by this method, alloy components added beyond a solubility limit to Al is compelled to exist in the dissolved state. The electrical resistivity of Al alloy containing an alloy element in the dissolved state is generally higher than that of pure Al. However, when an Al alloy film containing an alloy element beyond a solubility limit is heated, alloy components precipitate at the grain boundaries as an intermetallic compound, and as the Al alloy film is further heated, grain growth advances and Al starts re-crystallizing. While the temperature at which the precipitation and the grain growth occur in this manner is different depending upon the alloy element, the precipitation and the grain growth of the alloy components decrease the electrical resistivity of the Al alloy film.

The compressive stress inside the film increases as the grain growth progresses due to heating, and as the grain growth further progresses due to further heating, the limit will be surpassed and crystal grains will appear to the film surface as hillocks for the sake of stress relaxation. Alloying is effective in holding grains in a halt by means of the intermetallic compound precipitating at the grain boundaries, suppressing hillocks and enhancing the heat resisting property. A conventional approach has been to advance precipitation and grain growth of alloy components utilizing this phenomenon for realization of both a lower electrical resistivity and a heat resisting property of an Al alloy film. However, a lowered process temperature does not encourage sufficient precipitation of conventional alloy components as an intermetallic compound, which leads to a problem that grain growth does not advance and an electrical resistivity does not easily decrease.

For example, although the heat resisting temperature of Al-2 at % Nd disclosed in Patent Document 4 is as high as 350 degrees Celsius or more, the electrical resistivity is only 11.5 μΩ·cm after heat treatment at 250 degrees Celsius for 30 minutes, and although the heat resisting temperature of Al-2 at % Ni-0.6% Nd is as high as 350 degrees Celsius or more, the electrical resistivity decreases down to only 8.7 μΩ·cm after heat treatment at 250 degrees Celsius for 30 minutes, thus still leaving a room for further improvement.

SUMMARY OF THE INVENTION

As described above, although source and drain electrodes are most influenced by a lowered process temperature, since these electrodes always carry a current to read from and write in pixels, to suppress the electrical resistivity in these electrode portions is extremely effective in reducing the power consumption of a display device. Further, the low electrical resistivity in the electrode portions lowers a time constant which is determined by the product of the electrical resistance and the electrical capacity, which makes it possible to maintain a good display quality even when a display panel is to be fabricated in a large size.

The present invention has been made in light of the circumstance above, and accordingly, aims at establishing a technique with which it is possible, on the assumption that omission of barrier metal addressed above in relation to the conventional techniques is possible, to directly and securely contact an Al alloy film with pixel electrodes and achieve a low electrical resistivity between the pixel electrodes even when a low thermal processing temperature is used for the Al alloy film. More specifically, even when thermal processing at as low temperature as 250 degrees Celsius for 30 minutes is performed, it is possible to achieve the electrical resistivity of 7 μΩ·cm or lower of the Al alloy film without creating defects such as hillocks, provide a display device which is adaptive to a lowered processing temperature and provide a sputtering target for creation of Al alloy film which is useful for producing such a display device.

In the structure of a display device according to the present invention which solves the problems above, an Al alloy film and a conductive oxide film are connected directly with each other without any interposed refractory metal, and in this display device, at this contact interface, some or all Al alloy components precipitate or is concentrated, and the Al alloy film is made of Al alloy which contains as the alloy components 0.1 through 6 at % of at least one element selected from the group consisting of Ni, Ag, Zn, Cu and Ge and which further contains 1) 0.1 through 2 at % of at least one element selected from the group (hereinafter sometimes referred to as "group X") consisting of Mg, Cr, Mn, Ru, Rh, Pd, Ir, Pt, La, Ce, Pr, Gd, Tb, Sm, Eu, Ho, Er, Tm, Yb, Lu and Dy or 2) 0.1 through 1 at % of at least one element selected from the group (hereinafter also referred to as "group Z") consisting of Ti, V, Zr, Nb, Mo, Hf, Ta and W.

The Al alloy film according to the present invention, after deposited on a transparent substrate, preferably has an electrical resistivity of 7 μΩ·cm or lower following thermal processing at 250 degrees Celsius for 30 minutes.

The other structure according to the present invention is directed to a sputtering target for producing an Al alloy film which is a characteristic element of the display device above, and is made of Al alloy which contains, as alloy components, 0.1 through 6 at % of at least one element selected from the group consisting of Ni, Ag, Zn, Cu and Ge, and further contains 0.1 through 2 at % of at least one type of element selected from the group consisting of Mg, Cr, Mn, Ru, Rh, Pd, Ir, Pt, La, Ce, Pr, Gd, Tb, Sm, Eu, Ho, Er, Tm, Yb, Lu and Dy or 0.1 through 1 at % of at least one element selected from the group consisting of Ti, V, Zr, Nb, Mo, Hf, Ta and W.

According to the present invention, it is possible to contact an Al alloy film with pixel electrodes directly without forming a barrier metal layer and secure a sufficiently low electrical resistivity even when a relatively low thermal processing temperature such as 250 degrees Celsius or lower is used. The thermal processing temperature in this context means a processing temperature which becomes the highest during producing a TFT array for instance, and examples of this temperature for heating a substrate during film deposition by means of CVD to form various types of films, the temperature of a heat treat furnace during heat curing of a protection film, etc.

When the Al alloy film according to the present invention is applied to source/drain interconnections during producing a liquid crystal display panel in which a process temperature is recently becoming lower, it is possible to attain a low electrical resistivity at a low thermal processing temperature without impairing the advantage of the direct connection with the pixel electrodes.

DETAILED DESCRIPTION OF THE PREFERRED EMBODIMENTS

Figure 1:
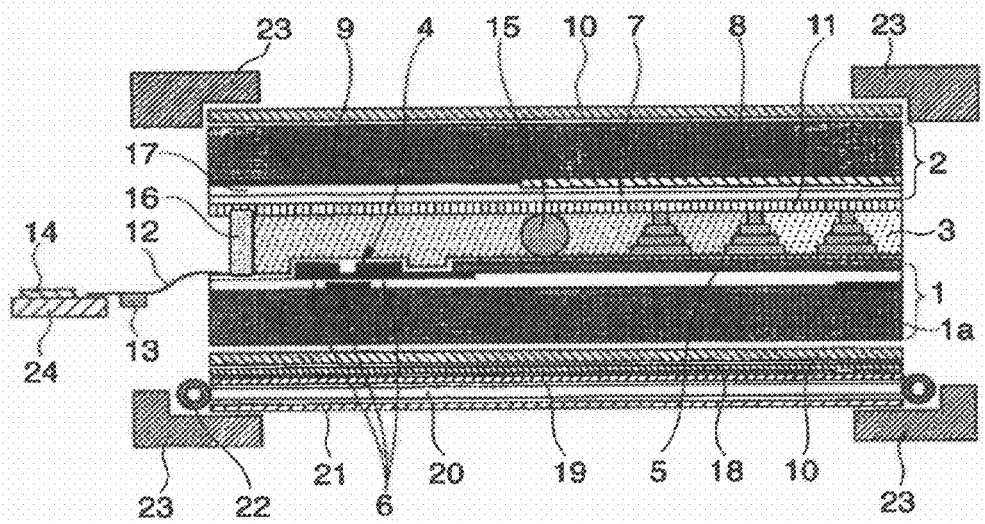
FIG. 1 is a schematic explanatory view of an enlarged cross sectional surface of exemplary structures of a liquid crystal panel substrate and a liquid crystal display device to which a display device array substrate according to the present invention is applied.

According to the present invention, for contact of the pixel electrodes and the Al alloy film, the Al alloy film contains, as its alloy components, 0.1 through 6 at % of at least one element selected from the group consisting of Ni, Ag, Zn, Cu and Ge, and further contains 0.1 through 2 at % of at least one element selected from the group X or 0.1 through 1 at % of at least one element selected from the group Z.

As the Al alloy film contains 0.1 through 6 at % of Ni or the like, and further contains 0.1 through 2 at % of at least one element selected from the group X or 0.1 through 1 at % of at least one element selected from the group Z, at a relatively low thermal processing temperature, precipitates or Ni or the like concentrated layer are formed at the contact interface with the pixel electrodes, which decreases the contact resistance.

Further, as described in detail later, precipitation as metallic compounds of elements belonging to these groups X and Z added mainly for improvement of the heat resisting property facilitates recrystallization of Al, reduces the electrical resistance of the Al alloy film itself and greatly decreases the electrical resistance as a whole including the contact surface.

Meanwhile, when containing 0.1 through 6 at % of Ni or the like and further containing 0.1 through 2 at % of at least one element selected from among Mg, La, Mn, Gd, Ta, Dy and Tb out of the elements selected from the groups X and Z or 0.1 through 1 at % of V, the Al alloy film is effective in remarkably improving the resistance against an alkaline developing solution.

During producing a display device, an interconnection pattern is formed at a step called photolithography. That is, a photosensitive resin (photoresist) is exposed with an UV light source and developed with an alkaline developing solution, and an interconnection pattern is formed of a resin. Following this, using the resin as a mask, an Al alloy film is etched, thereby obtaining an interconnection. At the stage of this development, the surface of the Al alloy film is exposed to the alkaline developing solution. A generally used developing solution contains 2.38 wt % of TMAH (tetramethyl ammonium hydroxide), and when the Al alloy film containing 0.1 through 6 at % of Ni is exposed to this developing solution, etching progresses at the speed of 80 through 120 nm/min.

On the contrary, in the case of Al alloy films to which Mg, La, Mn, V, Gd, Ta, Dy and Tb are added from the groups X and Z, the etching speed is suppressed down to 10 through 40 nm/min. Noting that the etching speed of pure Al in conventional use is 20 nm/min, empirically speaking, approximately double this speed will not cause a problem of film thinning.

Further, the developing time varies depending upon resins, exposure conditions and the like, and since the time that the surface of the Al alloy film is exposed to the developing solution is about some dozens of seconds or maximum within one minute and the film thickness of an interconnection is generally around 100 through 400 nm, if etching-induced slowing down of the etching speed approximately down to half or slower not only prevents elimination of the Al alloy film at the photolithographic step but obviates film thinning to quite a sufficient extent. This achieves precise processing of the interconnection pattern.

Rework, or redo of the photolithographic step is often executed. This means stripping of a photoresist and redo of the photolithographic step once again upon occurrence of an abnormal pattern or the like, and suppressed film thinning promises an advantage that rework can be done more than once.

It is therefore possible to significantly reduce the number of process steps and a manufacturing cost while maintaining the display quality of a display device such as a liquid crystal display at a high level.

While embodiments of the display device according to the present invention will now be described in detail with reference to the associated drawings, the present invention is not limited to the illustrated examples but may be implemented with appropriate modification to the extent meeting the intentions mentioned earlier and described below. Those modifications all fall within the technical scope of the invention.

Further, although the Al alloy film according to the present invention is applicable also to a display device of the passive matrix type which does not include thin film transistors, a reflection electrode of a reflection-type liquid crystal display device or the like, a gate electrode of an amorphous silicon TFT, and a TAB connection electrode for input/output of a signal to outside without forming a barrier metal layer between the TAB connection electrode and a TAB electrode, such embodiments will not be described.

FIG. 1 is a schematic explanatory view of an enlarged cross sectional surface of the structure of a liquid crystal panel which is mounted to a liquid crystal display apparatus to which the present invention is applied.

The liquid crystal panel shown in FIG. 1 includes a TFT array substrate 1, an opposed substrate 2 which is disposed facing the TFT array substrate 1, and a liquid crystal layer 3 which is disposed between the TFT array substrate 1 and the opposed substrate 2 and functions as a light modulation layer. The TFT array substrate 1 is formed by thin film transistors (TFTs) 4 arranged on an insulating transparent substrate (glass substrate) 1a, pixel electrodes 5 and interconnection portions 6 including scanning lines, signal lines, etc.

The opposed substrate 2 includes a common electrode 7 formed entirely on its surface which is on the TFT array substrate 1 side, a color filter 8 which is disposed at a position opposed against the pixel electrodes 5, and a light shielding film 9 which is disposed at a position opposed against the thin film transistors (TFTs) 4 on the TFT array substrate 1 and the interconnection portions 6.

Polarizer plates 10 and 10 are disposed on the outer surfaces of the insulating substrate forming the TFT array substrate 1 and the opposed substrate 2, and the opposed substrate 2 seats an orientation film 11 which aligns liquid crystal molecules of the liquid crystal layer 3 along a predetermined direction.

In the liquid crystal panel having this structure, an electric field developing between the opposed substrate 2 and the pixel electrodes 5 controls the direction of the orientation of the liquid crystal molecules within the liquid crystal layer 3 and modulates light which is transmitted by the liquid crystal layer 3 which is disposed between the TFT array substrate 1 and the opposed substrate 2, whereby the amount of light which is transmitted by the opposed substrate 2 is controlled and an image is displayed.

Further, the TFT array is driven by a driver circuit 13 and a control circuit 14, owing to a TAB tape 12 which is lead to outside the TFT array.

In FIG. 1, denoted at 15 is a spacer, denoted at 16 is a seal material, denoted at 17 is a protection film, denoted at 18 is a diffusion plate, denoted at 19 is a prism sheet, denoted at 20 is a light guide plate, denoted at 21 is a reflection plate, denoted at 22 is a back light, denoted at 23 is a holding frame, and denoted at 24 is a printed circuit board, which will be described later.

Figure 2:
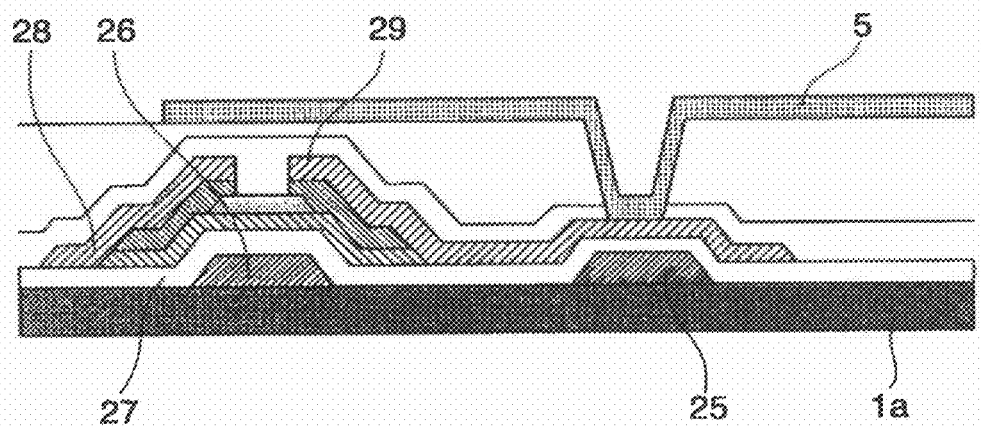
FIG. 2 is a schematic explanatory view of a cross sectional surface of an exemplary structure of a thin film transistor which is used in the display device array substrate according to the first embodiment of the present invention.

FIG. 2 is a schematic explanatory view of an enlarged cross sectional surface of the structure of a thin film transistor portion according to the first embodiment which is applied to the array substrate of the present invention. As shown in FIG. 2, a scanning line 25 is formed by an Al alloy film on the transparent substrate 1a, and a part of the scanning line 25 functions as a gate electrode 26 which controls turning on and off the thin film transistor. A signal line is formed by an Al alloy film such that the signal line intersects the scanning line 25 via a gate insulating film 27, and a part of the signal line functions as a source electrode 28 of the thin film transistor. This type is generally called the bottom gate type.

In a pixel region on the gate insulating film 27, there is the pixel electrode 5 of an ITO film which is obtained by mixing SnO with $In_2O_3$ for instance. A drain electrode 29 of the thin film transistor formed by an Al alloy film is electrically connected as a direct contact with the pixel electrode 5.

When a gate voltage is supplied to the gate electrode 26 via the scanning line 25 on the TFT array substrate 1, the thin film transistor turns on, and a drive voltage supplied in advance to the signal line reaches the pixel electrode 5 from the source electrode 28 via the drain electrode 29. As the drive voltage of a predetermined level is supplied to the pixel electrode 5, a potential difference is created from the opposed substrate 2 as described in relation to FIG. 1, the liquid crystal molecules contained in the liquid crystal layer 3 are aligned and light is modulated.

A method of producing the TFT array substrate 1 shown in FIG. 2 will now be described briefly. As the thin film transistor formed as a switching element, an amorphous silicon TFT using amorphous silicon hydride as a semiconductor layer will be described as an example.

FIGS. 3 through 10 will be referred to for describing one example of steps of producing the TFT array substrate 1.

Figure 3:
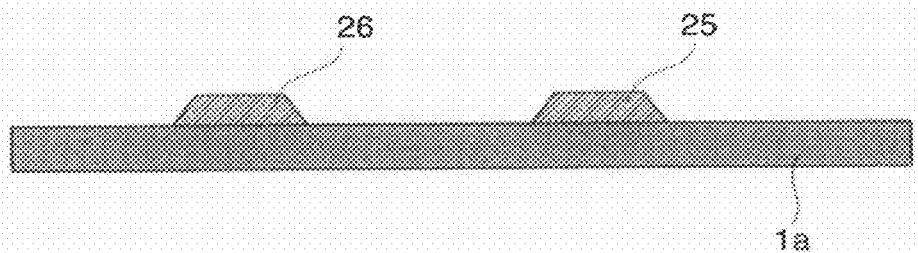
FIG. 3 is an explanatory diagram which shows in order an example of steps for producing the display device array substrate shown in FIG. 2.
Figure 4:
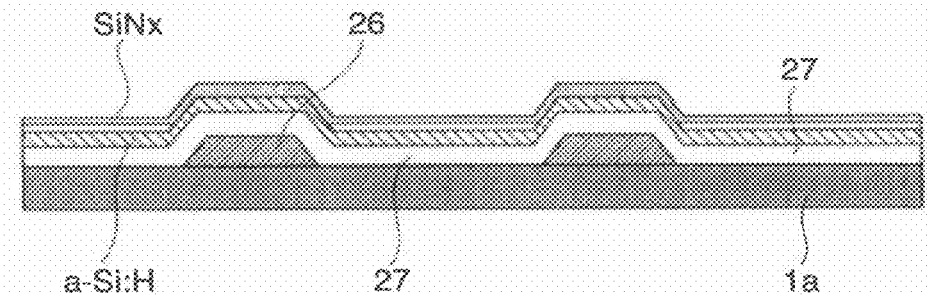
FIG. 4 is an explanatory diagram which shows in order an example of steps for producing the display device array substrate shown in FIG. 2.

First, by sputtering or the like, an Al alloy film is formed into the film thickness of about 200 nm on the glass substrate (transparent substrate) 1a, and the Al alloy film is patterned, thereby forming the gate electrode 26 and the scanning line 25 (FIG. 3). At this stage, it is desirable to etch the rim of the Al alloy film tapered at about 30 through 40 degrees so that the coverage of the gate insulating film 27 described later would be favorable. Next, as shown in FIG. 4, by plasma CVD or the like, the gate insulating film 27 is formed by a silicon oxide film (SiOx) whose film thickness is about 300 nm for instance, and an amorphous silicon hydride film (a-Si:H) whose film thickness is about 500 nm and a silicon nitride film (SiNx) whose film thickness is about 300 nm are formed for instance.

Figure 5:
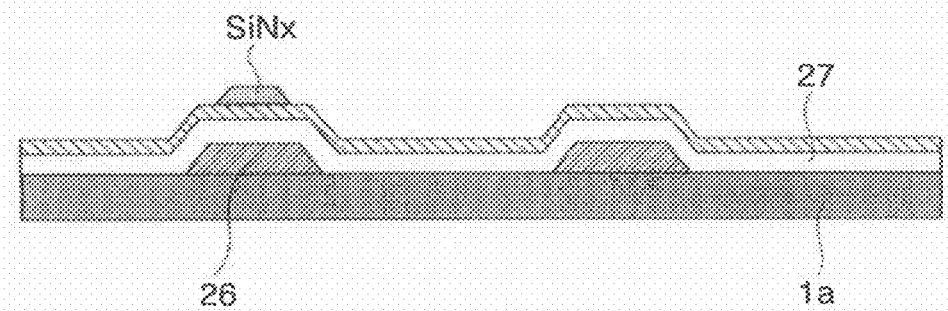
FIG. 5 is an explanatory diagram which shows in order an example of steps for producing the display device array substrate shown in FIG. 2.
Figure 6:
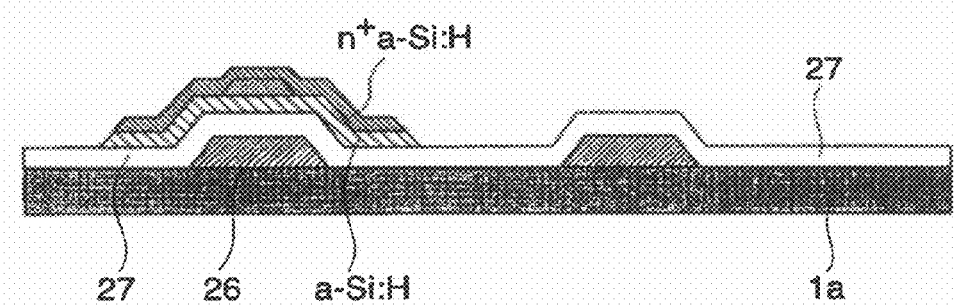
FIG. 6 is an explanatory diagram which shows in order an example of steps for producing the display device array substrate shown in FIG. 2.

This is followed by patterning of the silicon nitride film (SiNx) as shown in FIG. 5 by back surface exposure using the gate electrode 26 as a mask, thereby forming a channel protection film. After further forming an n+ amorphous silicon hydride film (n+a-Si:H) doped with phosphorus whose film thickness is about 50 nm for instance on this, the amorphous silicon hydride film (a-Si:H) and the n+ amorphous silicon hydride film (n+a-Si:H) are patterned as shown in FIG. 6.

Figure 7:
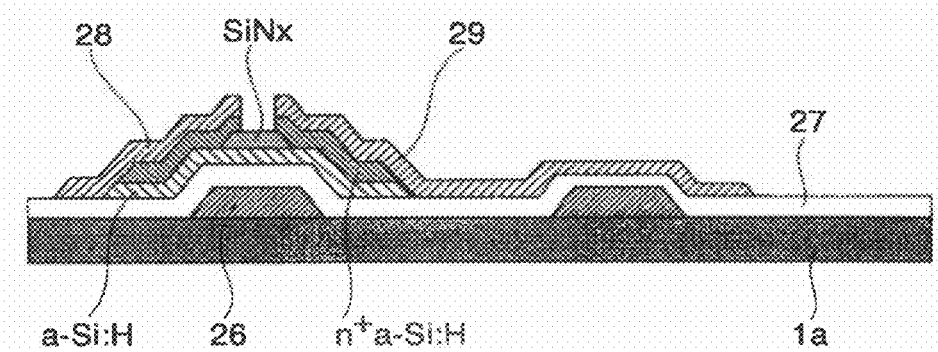
FIG. 7 is an explanatory diagram which shows in order an example of steps for producing the display device array substrate shown in FIG. 2.

An Al alloy film whose film thickness is about 300 nm for example is then formed on this, and through patterning as shown in FIG. 7, the source electrode 28 integrated with the signal line and the drain electrode 29 to be brought into contact with the pixel electrode 5 are formed. Using the source electrode 28 and the drain electrode 29 as a mask, the n⁺ amorphous silicon hydride film (n⁺a-Si:H) on the channel protection film (SiNx) is then removed.

Figure 8:
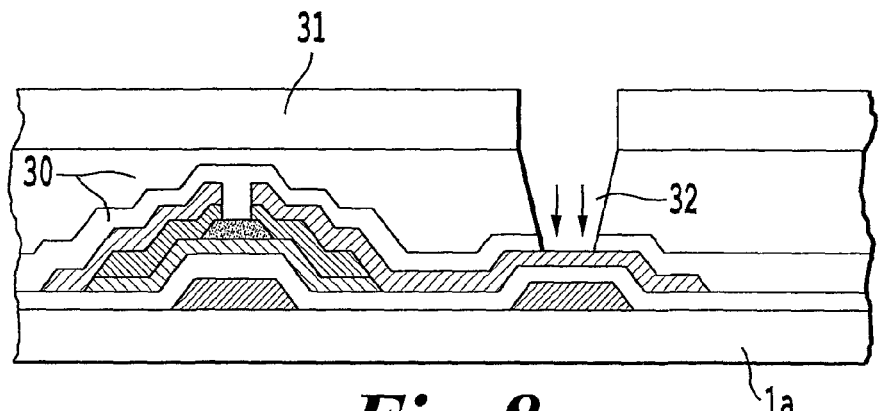
FIG. 8 is an explanatory diagram which shows in order an example of steps for producing the display device array substrate shown in FIG. 2.

As shown in FIG. 8, using a plasma CVD apparatus or the like for instance, a silicon nitride film 30 is deposited into the film thickness of about 300 nm for example, thereby obtaining a protection film. The film deposition is performed at about 250 degrees Celsius for instance. After forming a photoresist layer 31 on this silicon nitride film 30, the silicon nitride film 30 is patterned, and a contact hole 32 is formed in the silicon nitride film 30 by dry etching or the like for instance. Further, although not shown in the drawings, at the same time, a contact hole is formed in a TAB connection section on the gate electrode at an edge portion of the panel.

Figure 9:
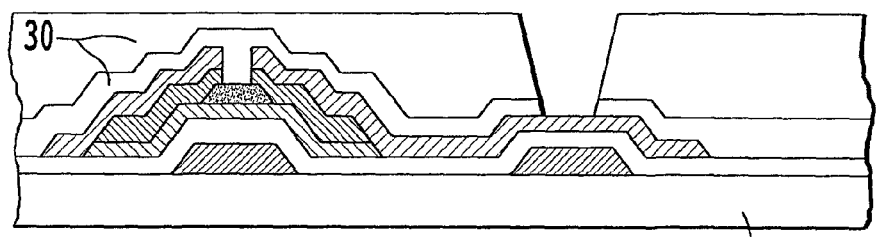
FIG. 9 is an explanatory diagram which shows in order an example of steps for producing the display device array substrate shown in FIG. 2.
Figure 10:
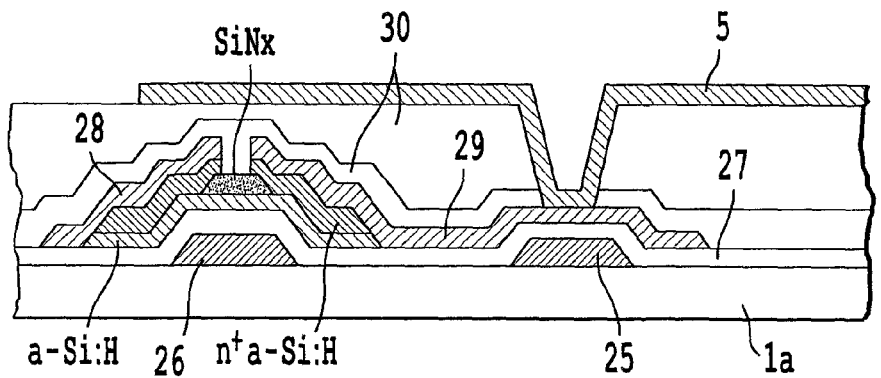
FIG. 10 is an explanatory diagram which shows in order an example of steps for producing the display device array substrate shown in FIG. 2.

Further, after ashing with oxygen plasma for instance as shown in FIG. 9, the photoresist layer 31 is stripped using a stripper solution containing amine or the like for instance, and at last, within a retention time of about eight hours for example, an ITO film whose film thickness is about 40 nm for instance is formed as shown in FIG. 10, and the pixel electrode 5 is obtained by patterning. At the same time, the ITO film is patterned for bonding with TAB in the TAB connection section of the gate electrode at the edge portion of the panel, which completes the TFT array substrate 1.

In the TFT array substrate fabricated by the method above, the drain electrode 29 of Al alloy and the pixel electrode 5 directly contact each other and the gate electrode 26 and the ITO film for TAB connection directly contact each other.

At this stage, as the material of the Al alloy film forming the drain electrode 29 for instance, Al—Ni alloy or alloy of Al and at least one element selected from the group consisting of Au, Ag, Zn, Cu, Sr, Sm, Ge and Bi may be used and a condition for forming the drain electrode 29 may be properly controlled, which still meaningfully reduces the contact resistance between the Al alloy film forming the drain electrode 29 and the pixel electrode 5, as Patent Literature 4 has clarified.

With respect to alloy containing Al—Ni for instance, after processing at the temperature of 250 degrees Celsius for 30 minutes, the electrical resistivity is 3.8 μΩ·cm in the case of Al-2 at % Ni, 5.8 μΩ·cm in the case of Al-4 at % Ni and 6.5 μΩ·cm in the case of Al-6 at % Ni, which means that an alloy film containing Al—Ni will well achieve a target value for a low electrical resistivity.

However, the heat resisting temperature of such Al—Ni alloy is as low as 150 through 200 degrees Celsius. When used for a source electrode or a drain electrode of an ordinary display device, noting that the maximum heating temperature is about 250 degrees Celsius, such Al—Ni alloy will be insufficient in terms of heat resisting property and is not practical.

As for Al alloy made of Al and at least one element selected from the group consisting of Ni, Ag, Zn, Cu and Ge, further study was done from the standpoints of both the type of the third component element and the quantity to add, in an effort to clarify alloy which will exhibit an electrical resistivity of 7 μΩ·cm or lower after thermal processing while securing a heat resisting property on the order of 250 degrees Celsius.

In consequence, it was found that mixing of the elements belonging to the groups X and Z described earlier in predetermined amounts from among a countless number of elements would form Al multi-component alloy which would exhibit an electrical resistivity of 7 μΩ·cm or lower after thermal processing while securing a heat resisting property which would not create hillocks or the like even in the presence of heat at about 250 degrees Celsius.

The elements belonging to the group X may be Mg, Cr, Mn, Ru, Rh, Pd, Ir, Pt, La, Ce, Pr, Gd, Tb, Sm, Eu, Ho, Er, Tm, Yb, Lu and Dy, from which one or two types may be used. For effective exhibition of an improved heat resisting property and a reduced electrical resistivity due to addition of these alloy elements, the amounts of the added elements needs be from 0.1 through 2 at %. Meanwhile, the elements belonging to the group Z may be Ti, V, Zr, Nb, Mo, Hf, Ta and W, from which one or two types may be used. For effective exhibition of an improved heat resisting property and a reduced electrical resistivity due to addition of these alloy elements, the amounts of the added elements needs be from 0.1 through 1 at %.

Any element belonging to any one of the groups X and Z, if added in the amount below 0.1 at %, will not achieve the level of the heat resisting property intended in the present invention, whereas when the content of the elements belonging to the group X exceeds 2 at % and the content of the elements belonging to the group Z exceeds 1 at %, the effect of reducing the electrical resistivity of the film material will be insufficient although the heat resisting property will improve more than needed. Considering both the heat resisting property and the lowered electrical resistivity of the film material, a preferable amount to add is from 0.3 at % to 1.8 at % as for the elements belonging to the group X and from 0.2 at % to 0.8 at % as for the elements belonging to the group Z. The content of each element in the case of adding two or more elements may be determined with reference to the total content.

As shown in Table 1 which will be described later, the elements belonging to the groups X and Z are selected based on examples regarding heat resisting properties and the effect of reducing the electrical resistivities which were confirmed through experiments, the criteria for selection can be explained with reference to the temperature-stress curve on an Al alloy film shown in FIG. 11.

Figure 11:
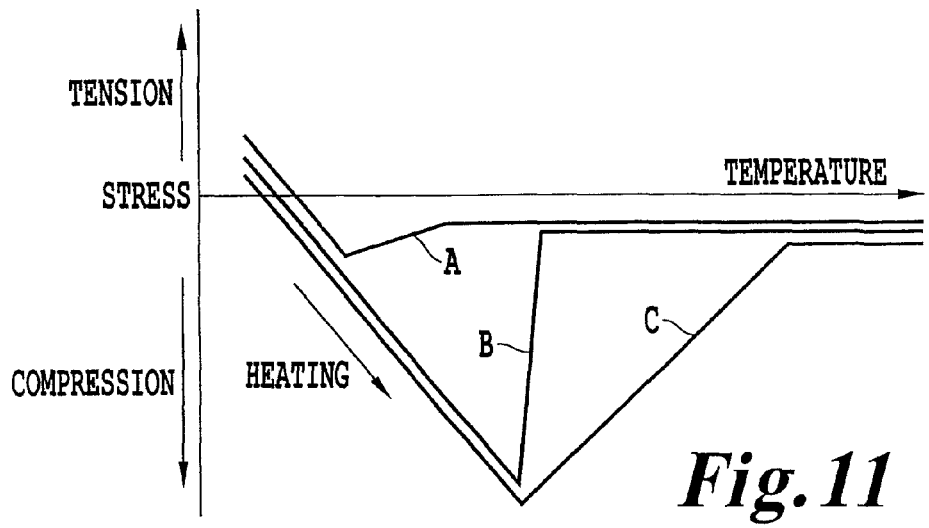
FIG. 11 shows a temperature-stress curve on an Al alloy film.

That is, in FIG. 11, the symbol A denotes pure Al, the symbol B denotes Al alloy to which the element belonging to the group X is added, and the symbol C denotes Al alloy to which the element belonging to the group Z is added.

The Al alloy film B to which the element belonging to the group X is added exhibits greater compressive stress with an increase of the temperature. Although grain growth is suppressed during the initial stage of the temperature increase, grain growth starts at a relatively low temperature and stress relaxation occurs abruptly within a narrow temperature range. It is considered that the dissolved element present in this alloy deposits as an intermetallic compound within a short period of time at this stage and that grain growth of Al advances and the electrical resistivity drops in accordance with the deposition. Namely, the electrical resistivity is sufficiently lowered at a relatively low heating temperature. On the other hand, further heating with complete stress relaxation pushes out crystal grains due to compressive stress developing inside the thin film and easily results in creation of hillocks or the like. The heat resisting temperature of this alloy is considered to be around a temperature of stress relaxation.

On the other hand, the Al alloy film to which the element belonging to the group Z is added similarly exhibits greater compressive stress with an increase of the temperature, and grain growth of Al starts in a similar temperature range. However, the elements belonging to the group Z is diffused from the dissolved state and precipitate as intermetallic compounds at a relatively slow speed, the intermetallic compounds precipitate gradually within a wide temperature range, and stress relaxation occurs gradually as the precipitation takes place. It therefore takes significant heating and a considerably long time until stress relaxation occurs sufficiently, the dissolved elements almost entirely precipitate as intermetallic compounds while grain growth of Al progresses and the electrical resistivity of the mother material of the film become low enough, for which amount the heat resisting property enhances. In short, as compared with the elements belonging to the group X, the elements belonging to the group Z are more effective in improving the heat resisting property as they more slowly deposit as intermetallic compounds, and thus, it is possible to sufficiently improve the heat resisting property even when the amount of adding these elements is suppressed relatively small.

While the electrical resistivity is dependent also upon the amount of adding the alloy elements, the elements belonging to the group Z, when added in smaller amounts than the elements belonging to the group X are, reduce the electrical resistivity even at a relatively low heating temperature as clarified later in relation to an example (Table 1).

Further, the elements belonging to the group Z, although can not be added in such large amounts as the amounts of adding the elements belonging to the group X, are characterized in that they are unlikely to have voids (holes) when deposited as electrode films. In other words, when an element which precipitates as an intermetallic compound all at once within a narrow temperature range during heating is chosen like those elements belonging to the group X, the more grain growth advances, the stronger the tensile stress created inside the film becomes during cooling down to a room temperature after heating, which could create voids. However, in the case of alloy from which an intermetallic compound precipitates gradually over time in accordance with a temperature increase like the elements belonging to the group Z, since precipitation and grain growth are interrupted upon heating to the same temperature range as that for the group X, stress relaxation does not progress sufficiently, and therefore, the tensile stress which remains in the film decreases during subsequent cooling down to a room temperature. Considering this, for prevention of voids attributable to the tensile stress, it is desirable to select the elements belonging to the group Z.

The reason that the content of Ni or the like, which serves as the base of added alloy, is set to the range from 0.1 to 6 at % in the present invention is because this is an important requirement to secure the heat resisting property of the Al alloy film, form an Ni or the like concentrated layer at the contact interface with the pixel electrodes, and reduce the contact resistance with the pixel electrodes. If the content of Ni or the like is below 0.1 at %, it is not possible to attain the level of the heat resisting property intended in the present invention, the Ni or the like concentrated layer created at the contact interface with the pixel electrodes becomes insufficient, and a satisfactory effect of reducing the contact resistance is not obtained. On the contrary, if the content of Ni or the like exceeds 6 at %, the electrical resistivity of the Al alloy film itself increases, the response speed of the pixels slows down, the consumption power increases and the quality as a display deteriorates to an impractical extent. Noting these advantages and disadvantages, it is desirable that the content of Ni or the like is preferably from 0.1 at % or over, more preferably from 0.2 at % to 6 at %, and even more preferably 5 at % or less.

According to the present invention, forming the Ni or the like concentrated layer in the surface of the Al alloy film is effective for reduction of the contact resistance (direct contact resistance) at the contact interface with the pixel electrodes, and the thickness of this concentrated layer is preferably from 0.5 nm or thicker, more preferably from 1.0 nm to 10 nm, and further preferably 5 nm or thinner. The average Ni concentration of this concentrated layer is preferably double or more of the average concentration in the entire Al alloy film, and more preferably, 2.5 times or more.

In an Al alloy film containing Ni or the like, Ni or the like beyond the solubility limit of Ni or the like inside the Al alloy film precipitates at the grain boundaries of Al alloy due to thermal processing or the like, a part of precipitating Ni or the like is diffused and concentrated in the surface of the Al alloy film, and an Ni or the like concentrated layer is formed. Further, according to the present invention, a halide of Ni or the like, due to its low vapor pressure, does not volatilize easily during etching of a contact hole for instance and stays in the surface of the Al alloy film, so that the concentration of Ni or the like in the surface of the Al alloy film becomes higher than the concentration of Ni or the like of the Al alloy bulk material. It is therefore possible to control the concentration of Ni or the like of the surface layer, the thickness of the concentrated layer and the like by means of proper control of conditions for the etching. While depending upon the elements belonging to the groups X and Z, the element may get partially concentrated toward the surface layer side at this stage, the technical scope of the present invention covers that as well.

When a display device including the TFT array substrate formed in this manner is used as a liquid crystal display apparatus for instance, it is not only possible to minimize the electrical resistance between the pixel electrodes and the interconnection portions for connection but also prevent defects such as hillocks owing to the effect of the improved heat resisting property because of the existence of the elements included in the groups X and Z. Further, since the elements included in the groups X and Z form intermetallic compounds together with the Al matrix material, Ni or the like and precipitate in the vicinity of the grain boundaries, recrystallization of Al which is the matrix material is facilitated and the electrical resistance of the matrix material decreases, and hence, it is possible to suppress an adverse influence over the quality of a displayed image as much as possible.

A liquid crystal display apparatus was fabricated as an experiment according to the embodiment above of the present invention, and it was confirmed that both the production yield and the display quality would be equally good as or better than those which would be obtained by a combination of an ITO film and barrier metal (of Mo, etc.). With this liquid crystal display apparatus, it is therefore possible to achieve equivalent capabilities to those of a conventional liquid crystal display apparatus, without disposing barrier metal. Hence, omission of barrier metal simplifies the manufacturing processing and contributes to a reduction of a manufacturing cost. Further, it is possible to realize a sufficiently low electrical resistivity at a relatively low heating temperature such as 250 degrees Celsius, it is possible to further enlarge the range of choices of the types of the materials of the display device, the processing conditions, etc.

Figure 12:
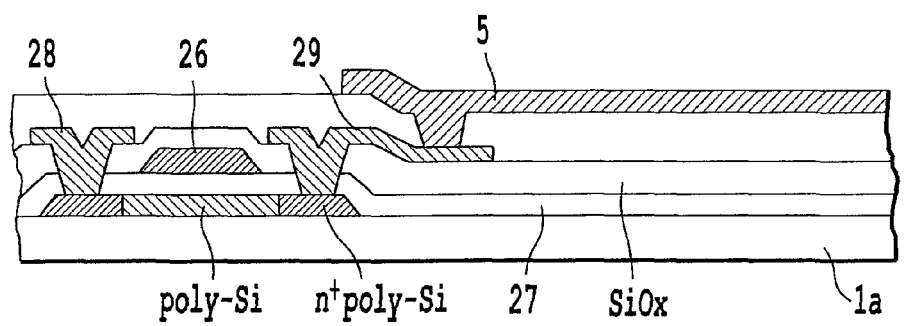
FIG. 12 is a schematic explanatory view of a cross sectional surface of an exemplary structure of a thin film transistor which is used in a display device array substrate according to other embodiment of the present invention.

FIG. 12 is a schematic explanatory view of an enlarged cross sectional surface of the structure of a thin film transistor according to other embodiment which is applicable to the array substrate of the present invention, and in the illustrated example, a thin film transistor having the top gate structure is used.

Figure 13:
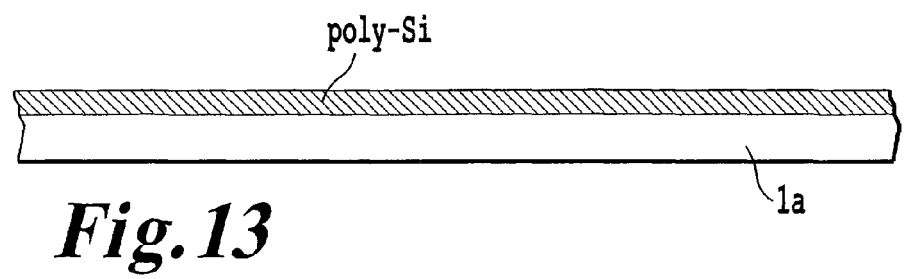
FIG. 13 is an explanatory diagram which shows in order an example of steps for producing the display device array substrate shown in FIG. 12.

As shown in FIG. 13, a scanning line of an Al alloy film is formed on a transparent substrate 1a, and a part of the scanning line functions as a gate electrode 26 which controls turning on and off of the thin film transistor. A signal line of Al alloy is formed such that the signal line intersects the scanning line via an inter-layer insulation film (SiOx), and a part of the signal line functions as a source electrode 28 of the thin film transistor.

In a pixel region on the inter-layer insulation film (SiOx), there is a pixel electrode 5 of an ITO film which is obtained by mixing SnO with $In_2O_3$ for instance, while a drain electrode 29 of Al alloy of the thin film transistor functions as a connection electrode portion which is electrically connected with the pixel electrode 5. That is, the drain electrode 29 of Al alloy of the thin film transistor directly contacts and is electrically connected with the pixel electrode 5.

Hence, as a gate voltage is fed to the gate electrode 26 via the scanning line on the TFT array substrate as in the example shown in FIG. 2 described earlier, the thin film transistor turns on and a drive voltage fed to the signal line reaches the pixel electrode 5 from the source electrode 28 via the drain electrode 29, and as the drive voltage of a predetermined level is supplied to the pixel electrode 5, a potential difference is created from an opposed electrode 10 as described in relation to FIG. 1, liquid crystal molecules contained in a liquid crystal layer 3 are aligned and light is modulated.

A method of producing the TFT array substrate shown in FIG. 12 will now be described. The thin film transistor formed in the array substrate according to this embodiment has the top gate structure which uses a polysilicon (poly-Si) film as a semiconductor layer. FIGS. 13 through 19 are drawings which schematically show steps of producing the array substrate according to the second embodiment.

First, using a plasma CVD apparatus or the like for instance, a silicon nitride (SiNx) film whose film thickness is about 50 nm and a silicon oxide (SiOx) film whose film thickness is about 100 nm are deposited at a substrate temperature of about 300 degrees Celsius for example, and further, an amorphous silicon hydride (a-Si:H) film whose film thickness is about 50 nm for example is then deposited, which is followed by thermal processing and laser annealing for the purpose of turning this amorphous silicon hydride (a-Si:H) film into polysilicon. The thermal processing may be atmospheric thermal processing at about 470 degrees Celsius for about one hour, and after dehydrogenation, using an eximer laser annealing apparatus for instance, laser is irradiated upon the amorphous silicon hydride (a-Si:H) film with the energy of about 230 $mJ/cm^2$ for example, whereby a polysilicon (poly-Si) film having the thickness of about 0.3 μm for instance is obtained (FIG. 13).

Figure 14:
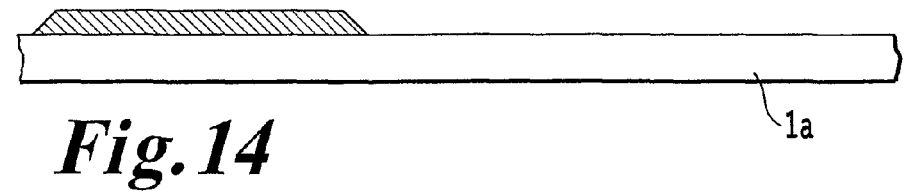
FIG. 14 is an explanatory diagram which shows in order an example of steps for producing the display device array substrate shown in FIG. 12.
Figure 15:
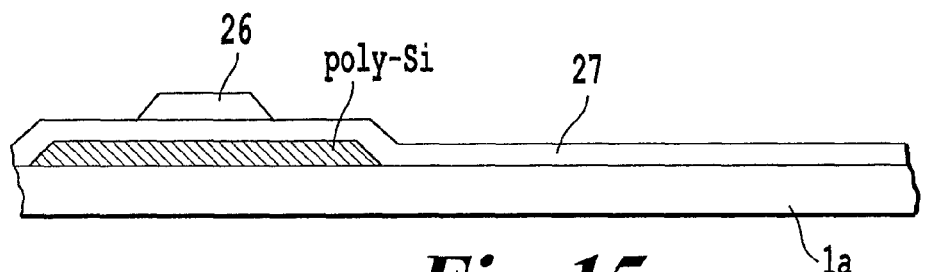
FIG. 15 is an explanatory diagram which shows in order an example of steps for producing the display device array substrate shown in FIG. 12.

Following this, as shown in FIG. 14, the polysilicon (poly-Si) film is patterned through plasma etching, etc. As shown in FIG. 15, a silicon oxide (SiOx) film is deposited into the film thickness of about 100 nm for example, thereby obtaining a gate insulating film 27. After film deposition of an Al alloy film which will become the gate electrode 26 integrated with the scanning line on thus obtained gate insulating film 27 into the film thickness of about 200 nm for instance by sputtering or the like, the Al alloy film is patterned by plasma etching or the like, and the gate electrode 26 integrated with the scanning line is obtained.

Figure 16:
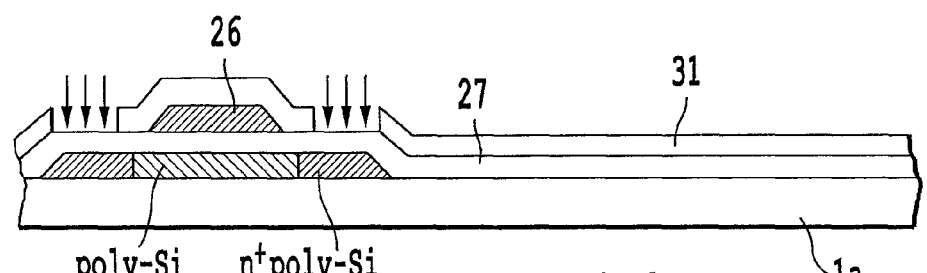
FIG. 16 is an explanatory diagram which shows in order an example of steps for producing the display device array substrate shown in FIG. 12.

As shown in FIG. 16, a mask is then formed with a photoresist 31 and doped with phosphorus at about 50 keV to $1 \times 10^{15}/cm^2$ using an ion implantation apparatus or the like for example, thereby forming an $n^+$ polysilicon ($n^+$poly-Si) film locally within the polysilicon (poly-Si) film, and the photoresist 31 is thereafter stripped, followed by thermal processing at about 500 degrees Celsius for instance which causes diffusion.

Figure 17:
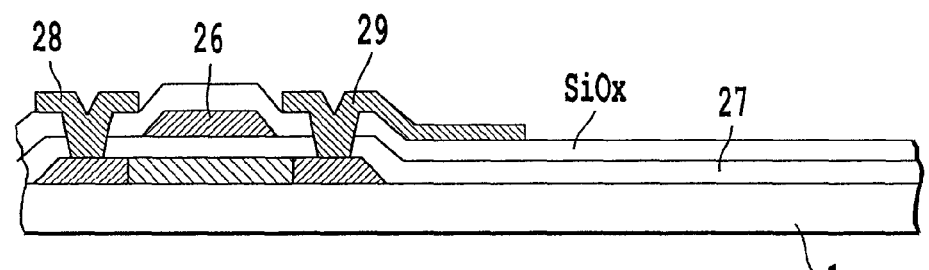
FIG. 17 is an explanatory diagram which shows in order an example of steps for producing the display device array substrate shown in FIG. 12.

After this, as shown in FIG. 17, a silicon oxide (SiOx) film is deposited into the film thickness of about 500 nm for example at a substrate temperature of about 250 degrees Celsius using a plasma CVD apparatus for example, thereafter forming an inter-layer insulation film, a photoresist is similarly patterned, thereby dry etching the inter-layer insulation (SiOx) film and the silicon oxide film of the gate insulating film 27, contact holes are formed, and after film deposition of an Al alloy film by sputtering into the film thickness of about 450 nm for example, the Al alloy film is patterned and the source electrode 28 and the drain electrode 29 integrated with the signal line are formed. As a result, the source electrode 28 and the drain electrode 29 are brought into contact with the $n^+$ polysilicon ($n^+$poly-Si) film each via a contact hole.

Figure 18:
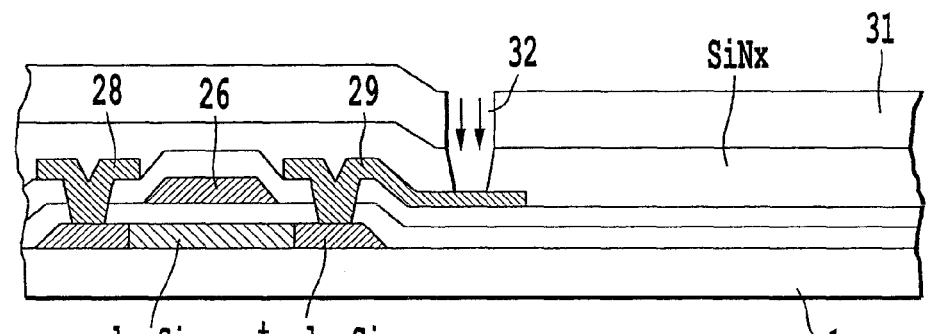
FIG. 18 is an explanatory diagram which shows in order an example of steps for producing the display device array substrate shown in FIG. 12.

A silicon nitride (SiNx) film is then deposited, as an inter-layer insulation film, into the film thickness of about 500 nm for example at a substrate temperature of about 250 degrees Celsius using a plasma CVD apparatus for example as shown in FIG. 18. After forming the photoresist layer 31 on this, the silicon nitride (SiNx) film is patterned, and by dry etching for instance, a contact hole 32 is formed in this silicon nitride (SiNx) film.

Figure 19:
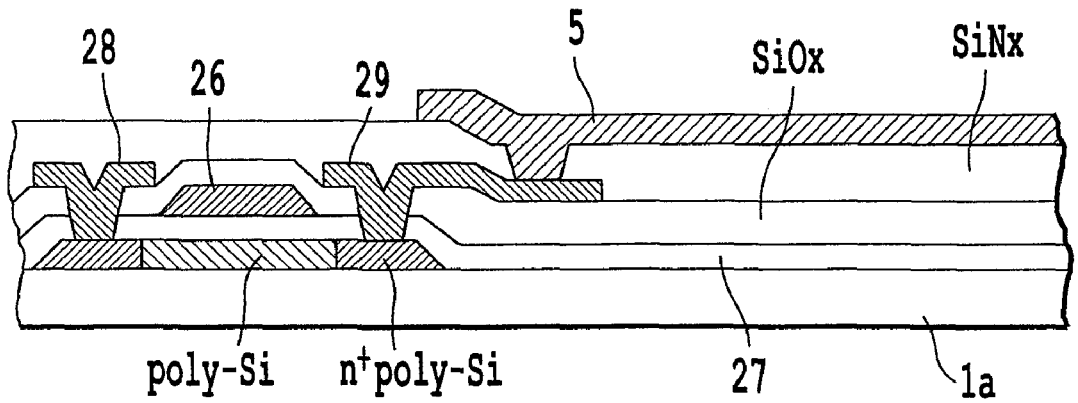
FIG. 19 is an explanatory diagram which shows in order an example of steps for producing the display device array substrate shown in FIG. 12.

This is followed by stripping of the photoresist using an amine-based stripper solution or the like in a similar fashion to that described above after ashing by means of oxygen plasma for example as shown in FIG. 19, an ITO film is deposited as described earlier and patterned through wet etching, thereby forming the pixel electrode 5. While the drain electrode 29 is brought into direct contact with the pixel electrode 5 during this processing, the Ni or the like concentrated layer is formed and the contact resistance decreases at the interface between the Al alloy film forming the drain electrode 29 and the pixel electrode 5, and as for the Al alloy film itself, deposition of Ni or the elements belonging to the groups X and Z as intermetallic compounds promotes recrystallization of Al and the electrical resistance of this film itself greatly decreases.

For stabilization of transistor characteristics, annealing is thereafter performed at about 250 degrees Celsius for about one hour, which completes the polysilicon TFT array substrate.

Using the TFT array substrate according to the second embodiment described above and a liquid crystal display apparatus including the TFT array substrate, similar effects to those according to the first example described earlier are obtained. Further, as in the first example, the second example as well permits use of the Al alloy according to the present invention as a reflection electrode of a reflection-type liquid crystal display.

The material of the pixel electrode 5 described above is preferably indium tin oxide or indium zinc oxide, and it is desirable that the electrical resistivity of the Al alloy film is adjusted to 7 μΩ·cm or less or more preferably 5 μΩ·cm or less by depositing some or all of the alloy components dissolved in the non-equilibrium state as intermetallic compounds or forming the concentrated layer.

While a method of forming the Al alloy film above may be vapor deposition, sputtering or the like, sputtering is particularly preferable.

Hence, the present invention covers a sputtering target made of Al alloy which contains, as the materials for forming an Al alloy film having the above composition, substantially the same composition as the composition described above, i.e., contains 0.1 to 6 at % of at least one element selected from the group consisting of Ni, Ag, Zn, Cu and Ge as an alloy component and 0.1 to 2 at % of at least one element selected from the group consisting of Mg, Cr, Mn, Ru, Rh, Pd, Ir, Pt, La, Ce, Pr, Gd, Tb, Sm, Eu, Ho, Er, Tm, Yb, Lu and Dy or 0.1 through 1 at %, of at least one element selected from the group consisting of Ti, V, Zr, Nb, Mo, Hf, Ta and W.

Using the TFT array substrate thus obtained, a liquid crystal display apparatus serving as a display device as that shown in FIG. 1 described earlier is completed.

In short, the surface of the TFT array substrate thus completed is coated with polyimide, dried and rubbed, to thereby form an orientation film.

On the other hand, as for an opposed substrate 2, chromium for instance is patterned into a matrix on a glass substrate and a light shielding film 9 is formed first. Color filters 8 of red, green and blue resins are then formed in gaps within the light shielding film 9. A transparent conductive film of ITO or the like is disposed as a common electrode 7 on the light shielding film 9 and the color filters 8, which completes an opposed electrode. The top-most layer of the opposed electrode is coated with polyimide for instance, dried and rubbed, whereby an orientation film 11 is obtained.

The surface of the array substrate 1 and that of the opposed substrate 2 bearing the orientation film 11 are then opposed against each other, and the two substrates are bonded to each other by a seal material 16 which may be a resin except for an injection inlet for introduction of liquid crystals. At this stage, by interposition of a spacer 15 between the two substrates or otherwise appropriately, the gap between the two substrates is maintained approximately constant.

The empty cell obtained in this manner is placed in vacuum, and with the injection inlet immersed in liquid crystals, the pressure is returned back to the atmospheric pressure gradually, whereby the liquid crystal material containing the liquid crystals is injected into the empty cell, a liquid crystal layer is formed and the injection inlet is closed. At last, polarizer plates 10 are bonded to the both outer surfaces of the cell, which completes the liquid crystal panel.

Further, as shown in FIG. 1, a driver circuit for driving the liquid crystal display apparatus is electrically connected with the liquid crystal panel and arranged in a side portion or a back surface portion of the liquid crystal panel. With a frame including an opening serving as a display surface of the liquid crystal panel, a back light 22 acting as a surface light source, a light guide plate 20 and a holding frame 23, the liquid crystal panel is held and the liquid crystal display apparatus is completed.

EXAMPLES

While the present invention will now be described in greater details with reference to examples, the present invention is not restricted by these examples but may be implemented with appropriate modification to the extent meeting the intentions mentioned earlier and described below. Those modifications all fall within the technical scope of the invention.

Example 1

With respect to the Al alloy films, which are shown in Tables 1, 3, 5, 7, 9 and 11, having various alloy compositions, the electrical resistances and the direct contact resistances with the Al alloy films brought in direct contact with pixel electrodes are measured and the heat resisting properties (hillock density) upon heating of the Al alloy films at 250 degrees Celsius for 30 minutes are investigated.

The experiment to obtain the measurements is as described below.

1) Structure of the pixel electrodes: Indium tin oxide (ITO) obtained by adding 10 mass % tin oxide to indium oxide 2) Thin film forming conditions: Gas atmosphere=Ar, Pressure=3 mTorr, Film thickness=200 nm 3) Heating condition: 250 degrees Celsius×30 minutes 4) Content of each element contained in Al alloy: Content of each element contained in Al alloys which are investigated in this Example was measured by using ICP (Inductive Coupled Plasma) emission spectrometry method.

5) Method of measuring the electrical resistivity of the Al alloy thin film: The electrical resistivity of the Al alloy thin film was measured by 4-terminal measurement using Kelvin patterns, and those exhibited the electrical resistivity of 7 $\mu\Omega\cdot cm$ or lower were determined favorable (o) but those exhibited the electrical resistivity exceeding 7 $\mu\Omega\cdot cm$ were determined defective (x).

Figure 20:
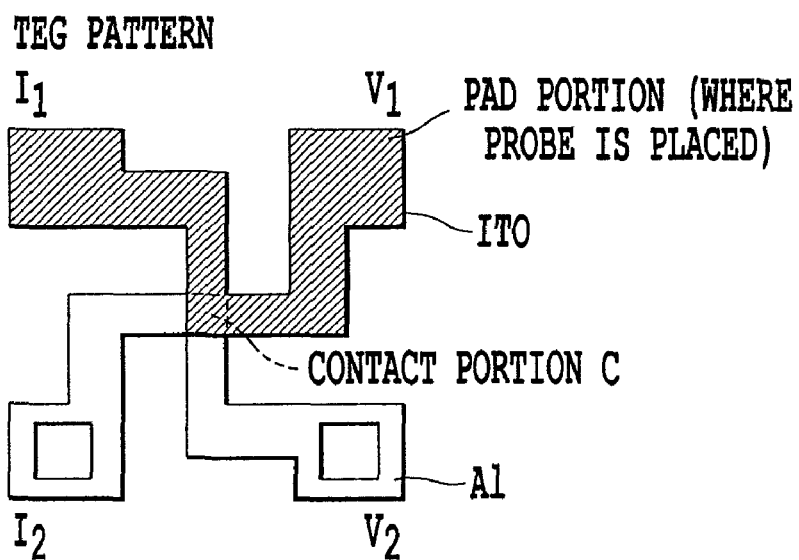
FIG. 20 is a drawing which shows a Kelvin pattern used for measurement of the contact resistance between an Al alloy film and a transparent conductive oxide film.

6) Method of measuring the direct contact resistivity: Kelvin patterns as those shown in FIG. 20 (having the contact hole size of 10 $\mu m \times 10$ $\mu m$) were fabricated, and 4-terminal measurement (a method according to which a current was supplied to ITO-Al alloy and a voltage drop between ITO-Al alloy was measured using a different terminal) was performed. In short, a current I was fed between $I_1$ and $I_2$ shown in FIG. 20, a voltage V between $V_1$ and $V_2$ was monitored, the direct contact resistance R in a contact portion C was accordingly calculated as $[R=(V_2-V_1)/I_2]$, and those exhibited the contact resistance of 1 k$\Omega$ or lower were determined favorable (o) but those exhibited the contact resistance exceeding 1 k$\mu$ were determined defective (x).

7) Method of measuring the heat resisting properties: Under the conditions described in 3), Al alloy thin films alone were formed on glass substrates. Then line-and-space patterns whose widths were 10 $\mu m$ were formed, vacuum heat treatment was performed at 250 degrees Celsius for 30 minutes, the surfaces of interconnections were observed with SEM, and the number of hillocks having the diameters of 0.1 $\mu m$ or larger was counted. Those exhibited the hillock density of $1\times10^{-9}/m^2$ or lower were determined favorable (o) but those exhibited the hillock density exceeding $1\times10^{-9}/m^2$ were determined defective (x).

8) Method of measuring the thickness of the concentrated layer containing α and the content of α in the concentrated layer: With respect to a part of the samples shown in Tables 1, 3, 5, 7, 9 and 11, the film thicknesses after thermal processing of the α concentrated layers (Ni-concentrated layer in Table 1, Ag-concentrated layer in Table 2, Zn-concentrated layer in Table 3, Cu-concentrated layer in Table 4, and Ge-concentrated layer in Table 5) were identified through cross sectional TEM observation using "FE-TEM HF-2000" manufactured by Hitachi, Ltd. Furthermore, the contents of α in the α-concentrated layers were determined by component analysis from cross sectional TEM samples using EDX (Sigma manufactured by KEVEX).

The results are added to Tables 1 through 10.

TABLE 1

| No. | Base Alloy | Third Element (X) Type | The Amount Added (at %) | Heat Resisting Property (hillock density) (250° C.) | Electric Resistance (after heating at 250° C. for 30 min) Film Material | Direct Contact Resistance |
|---|---|---|---|---|---|---|
| 1 | Al-2 at % Ni | — | — | X | o | o |
| 2 | Al-2 at % Ni | Nd | 0.6 | o | X | o |
| 3 | Al-2 at % Ni—X | Pt | 0.01 | X | o | o |
| 4 | | Mg | 1 | o | o | o |
| 5 | | Cr | 1 | o | o | o |
| 6 | | Mn | 1 | o | o | o |
| 7 | | Ru | 1 | o | o | o |
| 8 | | Rh | 1 | o | o | o |
| 9 | | Pd | 1 | o | o | o |
| 10 | | Ir | 1 | o | o | o |
| 11 | | Pt | 1 | o | o | o |

TABLE 1-continued

| No. | Base Alloy | Third Element (X) Type | The Amount Added (at %) | Heat Resisting Property (hillock density) (250° C.) | Electric Resistance (after heating at 250° C. for 30 min) Film Material | Direct Contact Resistance |
|---|---|---|---|---|---|---|
| 12 |  | La | 1 | ○ | ○ | ○ |
| 13 |  | Gd | 1 | ○ | ○ | ○ |
| 14 |  | Tb | 1 | ○ | ○ | ○ |
| 15 |  | Dy | 1 | ○ | ○ | ○ |
| 16 |  | Ce | 1 | ○ | ○ | ○ |
| 17 |  | Sm | 1 | ○ | ○ | ○ |
| 18 |  | Eu | 1 | ○ | ○ | ○ |
| 19 |  | Er | 1 | ○ | ○ | ○ |
| 20 |  | Pt | 2.5 | ○ | X | ○ |
| 21 |  | Ir | 2.5 | ○ | X | ○ |
| 22 | Al-2 at % Ni—Z | W | 0.01 | X | ○ | ○ |
| 23 |  | Ti | 0.5 | ○ | ○ | ○ |
| 24 |  | V | 0.5 | ○ | ○ | ○ |
| 25 |  | Zr | 0.5 | ○ | ○ | ○ |
| 26 |  | Nb | 0.5 | ○ | ○ | ○ |
| 27 |  | Mo | 0.5 | ○ | ○ | ○ |
| 28 |  | Hf | 0.5 | ○ | ○ | ○ |
| 29 |  | Ta | 0.5 | ○ | ○ | ○ |
| 30 |  | W | 0.5 | ○ | ○ | ○ |
| 31 |  | Nb | 2.5 | ○ | X | ○ |
| 32 |  | Ta | 1.5 | ○ | X | ○ |
| 33 | Al-2 at % Ni | Sn | 1 | X | ○ | ○ |
| 34 | Al-0.05 at % Ni—X | Pt | 1 | ○ | ○ | X |
| 35 | Al-1 at % Ni—X |  |  | ○ | ○ | ○ |
| 36 | Al-3 at % Ni—X |  |  | ○ | ○ | ○ |
| 37 | Al-6 at % Ni—X |  |  | ○ | ○ | ○ |
| 38 | Al-8 at % Ni—X |  |  | ○ | X | ○ |
| 39 | Al-0.05 at % Ni—Z | Ta | 0.5 | ○ | ○ | X |
| 40 | Al-1 at % Ni—Z |  |  | ○ | ○ | ○ |
| 41 | Al-3 at % Ni—Z |  |  | ○ | ○ | ○ |
| 42 | Al-6 at % Ni—Z |  |  | ○ | ○ | ○ |
| 43 | Al-8 at % Ni—Z |  |  | ○ | X | ○ |

It is noted that, in Table 1, the film thickness of the Ni-concentrated layer and the content of Ni in the Ni-concentrated layer were measured after thermal processing for each sample which satisfied the conditions of the present invention. In the result, the film thickness of the each Ni-concentrated layer was within the range of about 0.5 to 2 nm, and the content of Ni in the each Ni-concentrated layer was generally within the range of twice to nine times as much as the average content of Ni in each thin film of Al alloy (not shown in Table 1).

In Table 1, the results of experiments are shown, in which amounts of the third elements selected from the elements belonging to the group X or Z were changed. It was confirmed that similar results of the experiments could be obtained when other elements belonging to the group X or Z and not listed in Table 1 were used as the third elements.

TABLE 2

| No. | Composition | Direct Contact Resistance (10 μm × 10 μm Contact Hall) Contact Resistivity (Ω) | Value |
|---|---|---|---|
| 1 | Al-6 at % Ni | 10 | ⊚ |
| 2 | Al-6 at % Ni-0.5 at % La | 22 | ⊚ |
| 3 | Al-2 at % Ni | 100 | ⊚ |
| 4 | Al-2 at % Ni-0.5 at % La | 73 | ⊚ |
| 5 | Al-2 at % Ni-1.8 at % La | 73 | ⊚ |
| 6 | Al-2 at % Ni-0.8 at % Gd | 29 | ⊚ |
| 7 | Al-2 at % Ni-0.3 at % Mn | 153 | ⊚ |
| 8 | Al-0.1 at % Ni | 317 | ⊚ |
| 9 | Al-0.1 at % Ni-0.5 at % La | 332 | ○ |
| 10 | Al | 5 × 10⁵ | X |
| 11 | Mo | 10 | ⊚ |

TABLE 3

| No. | Base Alloy | Third Element (X) Type | The Amount Added (at %) | Heat Resisting Property (hillock density) (250° C.) | Electric Resistance (after heating at 250° C. for 30 min) Film Material | Direct Contact Resistance |
|---|---|---|---|---|---|---|
| 1 | Al-2 at % Ag | — | — | X | ○ | ○ |
| 2 | Al-2 at % Ag | Nd | 0.6 | ○ | X | ○ |
| 3 | Al-2 at % Ag—X | Pt | 0.01 | X | ○ | ○ |
| 4 |  | Mg | 1 | ○ | ○ | ○ |
| 5 |  | Cr | 1 | ○ | ○ | ○ |
| 6 |  | Mn | 1 | ○ | ○ | ○ |
| 7 |  | Ru | 1 | ○ | ○ | ○ |
| 8 |  | Rh | 1 | ○ | ○ | ○ |
| 9 |  | Pd | 1 | ○ | ○ | ○ |

TABLE 3-continued

| No. | Base Alloy | Third Element (X) Type | The Amount Added (at %) | Heat Resisting Property (hillock density) (250° C.) | Electric Resistance (after heating at 250° C. for 30 min) Film Material | Direct Contact Resistance |
|---|---|---|---|---|---|---|
| 10 | | Ir | 1 | ○ | ○ | ○ |
| 11 | | Pt | 1 | ○ | ○ | ○ |
| 12 | | Gd | 1 | ○ | ○ | ○ |
| 13 | | Tb | 1 | ○ | ○ | ○ |
| 14 | | Dy | 1 | ○ | ○ | ○ |
| 15 | | Ce | 1 | ○ | ○ | ○ |
| 16 | | Sm | 1 | ○ | ○ | ○ |
| 17 | | Eu | 1 | ○ | ○ | ○ |
| 18 | | Er | 1 | ○ | ○ | ○ |
| 19 | | Pt | 2 | ○ | X | ○ |
| 20 | | Ir | 2.5 | ○ | X | ○ |
| 21 | Al-2 at % Ag—Z | W | 0.01 | X | ○ | ○ |
| 22 | | Ti | 0.5 | ○ | ○ | ○ |
| 23 | | V | 0.5 | ○ | ○ | ○ |
| 24 | | Zr | 0.5 | ○ | ○ | ○ |
| 25 | | Nb | 0.5 | ○ | ○ | ○ |
| 26 | | Mo | 0.5 | ○ | ○ | ○ |
| 27 | | Hf | 0.5 | ○ | ○ | ○ |
| 28 | | W | 0.5 | ○ | ○ | ○ |
| 29 | | Nb | 2.5 | ○ | X | ○ |
| 30 | | Ta | 1.5 | ○ | X | ○ |
| 31 | Al-2 at % Ag | Sn | 1 | X | ○ | ○ |
| 32 | Al-0.05 at % Ag—X | La | 1 | ○ | ○ | X |
| 33 | Al-0.1 at % Ag—X | | | ○ | ○ | ○ |
| 34 | Al-1 at % Ag—X | | | ○ | ○ | ○ |
| 35 | Al-2 at % Ag—X | | | ○ | ○ | ○ |
| 36 | Al-6 at % Ag—X | | | ○ | X | ○ |
| 37 | Al-0.05 at % Ag—Z | Ta | 0.5 | ○ | ○ | X |
| 38 | Al-0.1 at % Ag—Z | | | ○ | ○ | ○ |
| 39 | Al-1 at % Ag—Z | | | ○ | ○ | ○ |
| 40 | Al-2 at % Ag—Z | | | ○ | ○ | ○ |
| 41 | Al-6 at % Ag—Z | | | ○ | X | ○ |

It is noted that, in Table 3, the film thickness of the Ag-concentrated layer and the content of Ag in the Ag-concentrated layer were measured after thermal processing for each sample which satisfied the conditions of the present invention. In the result, the film thickness of the each Ag-concentrated layer was within the range of about 0.5 to 2 nm, and the content of Ag in the each Ag-concentrated layer was generally within the range of twice to nine times as much as the average content of Ag in each thin film of Al alloy (not shown in Table 3).

In Table 3, the results of experiments are shown, in which amounts of the third elements selected from the elements belonging to the group X or Z were changed. It was confirmed that similar results of the experiments could be obtained when other elements belonging to the group X or Z and not listed in Table 3 were used as the third elements.

TABLE 4

| | | Direct Contact Resistance (10 μm × 10 μm Contact Hall) | |
|---|---|---|---|
| No. | Composition | Contact Resistivity (Ω) | Value |
| 1 | Al-6 at % Ag | 8 | ◎ |
| 2 | Al-6 at % Ag-0.5 at % La | 12 | ◎ |
| 3 | Al-2 at % Ag | 40 | ◎ |
| 4 | Al-2 at % Ag-0.5 at % La | 39 | ◎ |
| 5 | Al-2 at % Ag-1.8 at % Mg | 35 | ◎ |
| 6 | Al-2 at % Ag-0.8 at % Gd | 35 | ◎ |
| 7 | Al-0.1 at % Ag | 220 | ○ |
| 8 | Al-0.1 at % Ag-0.5 at % La | 255 | ○ |

TABLE 5

| No. | Base Alloy | Third Element (X) Type | The Amount Added (at %) | Heat Resisting Property (hillock density) (250° C.) | Electric Resistance (after heating at 250° C. for 30 min) Film Material | Direct Contact Resistance |
|---|---|---|---|---|---|---|
| 1 | Al-2 at % Zn | — | — | X | ○ | ○ |
| 2 | Al-2 at % Zn | Nd | 0.6 | ○ | X | ○ |
| 3 | Al-2 at % Zn—X | Pt | 0.01 | X | ○ | ○ |
| 4 | | Mg | 1 | ○ | ○ | ○ |
| 5 | | Cr | 1 | ○ | ○ | ○ |
| 6 | | Mn | 1 | ○ | ○ | ○ |
| 7 | | Ru | 1 | ○ | ○ | ○ |
| 8 | | Rh | 1 | ○ | ○ | ○ |
| 9 | | Pd | 1 | ○ | ○ | ○ |
| 10 | | Ir | 1 | ○ | ○ | ○ |

TABLE 5-continued

| No. | Base Alloy | Third Element (X) Type | The Amount Added (at %) | Heat Resisting Property (hillock density) (250° C.) | Electric Resistance (after heating at 250° C. for 30 min) Film Material | Direct Contact Resistance |
|---|---|---|---|---|---|---|
| 11 | | Pt | 1 | ○ | ○ | ○ |
| 12 | | Gd | 1 | ○ | ○ | ○ |
| 13 | | Tb | 1 | ○ | ○ | ○ |
| 14 | | Dy | 1 | ○ | ○ | ○ |
| 15 | | Ce | 1 | ○ | ○ | ○ |
| 16 | | Sm | 1 | ○ | ○ | ○ |
| 17 | | Eu | 1 | ○ | ○ | ○ |
| 18 | | Er | 1 | ○ | ○ | ○ |
| 19 | | Pt | 2 | ○ | X | ○ |
| 20 | | Ir | 2.5 | ○ | X | ○ |
| 21 | Al-2 at % Zn—Z | W | 0.01 | X | ○ | ○ |
| 22 | | Ti | 0.5 | ○ | ○ | ○ |
| 23 | | V | 0.5 | ○ | ○ | ○ |
| 24 | | Zr | 0.5 | ○ | ○ | ○ |
| 25 | | Nb | 0.5 | ○ | ○ | ○ |
| 26 | | Mo | 0.5 | ○ | ○ | ○ |
| 27 | | Hf | 0.5 | ○ | ○ | ○ |
| 28 | | W | 0.5 | ○ | ○ | ○ |
| 29 | | Nb | 2.5 | ○ | X | ○ |
| 30 | | Ta | 1.5 | ○ | X | ○ |
| 31 | Al-2 at % Zn | Sn | 1 | X | ○ | ○ |
| 32 | Al-0.05 at % Zn—X | La | 1 | ○ | ○ | X |
| 33 | Al-0.1 at % Zn—X | | | ○ | ○ | ○ |
| 34 | Al-1 at % Zn—X | | | ○ | ○ | ○ |
| 35 | Al-2 at % Zn—X | | | ○ | ○ | ○ |
| 36 | Al-6 at % Zn—X | | | ○ | X | ○ |
| 37 | Al-0.05 at % Zn—Z | | 0.5 | ○ | ○ | X |
| 38 | Al-0.1 at % Zn—Z | | | ○ | ○ | ○ |
| 39 | Al-1 at % Zn—Z | | | ○ | ○ | ○ |
| 40 | Al-2 at % Zn—Z | | | ○ | ○ | ○ |
| 41 | Al-6 at % Zn—Z | | | ○ | X | ○ |

It is noted that, in Table 5, the film thickness of the Zn-concentrated layer and the content of Zn in the Zn-concentrated layer were measured after thermal processing for each sample which satisfied the conditions of the present invention. In the result, the film thickness of the each Zn-concentrated layer was within the range of about 0.5 to 2 nm, and the content of Zn in the each Zn-concentrated layer was generally within the range of twice to nine times as much as the average content of Zn in each thin film of Al alloy (not shown in Table 5).

In Table 5, the results of experiments are shown, in which amounts of the third elements selected from the elements belonging to the group X or Z were changed. It was confirmed that similar results of the experiments could be obtained when other elements belonging to the group X or Z and not listed in Table 5 were used as the third elements.

TABLE 6

| No. | Composition | Direct Contact Resistance (10 μm × 10 μm Contact Hall) Contact Resistivity (Ω) | Value |
|---|---|---|---|
| 1 | Al-6 at % Zn | 33 | ⊚ |
| 2 | Al-6 at % Zn-0.5 at % La | 50 | ⊚ |
| 3 | Al-2 at % Zn | 152 | ⊚ |
| 4 | Al-2 at % Zn-0.5 at % La | 121 | ⊚ |
| 5 | Al-2 at % Zn-1.8 at % Mg | 108 | ⊚ |
| 6 | Al-2 at % Zn-0.8 at % Gd | 97 | ⊚ |
| 7 | Al-0.1 at % Zn | 405 | ○ |
| 8 | Al-0.1 at % Zn-0.5 at % La | 325 | ○ |

TABLE 7

| No. | Base Alloy | Third Element (X) Type | The Amount Added (at %) | Heat Resisting Property (hillock density) (250° C.) | Electric Resistance (after heating at 250° C. for 30 min) Film Material | Direct Contact Resistance |
|---|---|---|---|---|---|---|
| 1 | Al-2 at % Cu | — | — | X | ○ | ○ |
| 2 | Al-2 at % Cu | Nd | 0.6 | ○ | X | ○ |
| 3 | Al-2 at % Cu—X | Pt | 0.01 | X | ○ | ○ |
| 4 | | Mg | 1 | ○ | ○ | ○ |
| 5 | | Cr | 1 | ○ | ○ | ○ |
| 6 | | Mn | 1 | ○ | ○ | ○ |
| 7 | | Ru | 1 | ○ | ○ | ○ |
| 8 | | Rh | 1 | ○ | ○ | ○ |
| 9 | | Pd | 1 | ○ | ○ | ○ |
| 10 | | Ir | 1 | ○ | ○ | ○ |
| 11 | | Pt | 1 | ○ | ○ | ○ |

TABLE 7-continued

| No. | Base Alloy | Third Element (X) Type | The Amount Added (at %) | Heat Resisting Property (hillock density) (250° C.) | Electric Resistance (after heating at 250° C. for 30 min) Film Material | Direct Contact Resistance |
|---|---|---|---|---|---|---|
| 12 |  | Gd | 1 | ○ | ○ | ○ |
| 13 |  | Tb | 1 | ○ | ○ | ○ |
| 14 |  | Dy | 1 | ○ | ○ | ○ |
| 15 |  | Ce | 1 | ○ | ○ | ○ |
| 16 |  | Sm | 1 | ○ | ○ | ○ |
| 17 |  | Eu | 1 | ○ | ○ | ○ |
| 18 |  | Er | 1 | ○ | ○ | ○ |
| 19 |  | Pt | 2 | ○ | X | ○ |
| 20 |  | Ir | 2.5 | ○ | X | ○ |
| 21 | Al-2 at % Cu—Z | W | 0.01 | X | ○ | ○ |
| 22 |  | Ti | 0.5 | ○ | ○ | ○ |
| 23 |  | V | 0.5 | ○ | ○ | ○ |
| 24 |  | Zr | 0.5 | ○ | ○ | ○ |
| 25 |  | Nb | 0.5 | ○ | ○ | ○ |
| 26 |  | Mo | 0.5 | ○ | ○ | ○ |
| 27 |  | Hf | 0.5 | ○ | ○ | ○ |
| 28 |  | W | 0.5 | ○ | ○ | ○ |
| 29 |  | Nb | 2.5 | ○ | X | ○ |
| 30 |  | Ta | 1.5 | ○ | X | ○ |
| 31 | Al-2 at % Cu | Sn | 1 | X | ○ | ○ |
| 32 | Al-0.05 at % Cu—X | La | 1 | ○ | ○ | X |
| 33 | Al-0.1 at % Cu—X |  |  | ○ | ○ | ○ |
| 34 | Al-1 at % Cu—X |  |  | ○ | ○ | ○ |
| 35 | Al-2 at % Cu—X |  |  | ○ | ○ | ○ |
| 36 | Al-6 at % Cu—X |  |  | ○ | X | ○ |
| 37 | Al-0.05 at % Cu—Z | Ta | 0.5 | ○ | ○ | X |
| 38 | Al-0.1 at % Cu—Z |  |  | ○ | ○ | ○ |
| 39 | Al-1 at % Cu—Z |  |  | ○ | ○ | ○ |
| 40 | Al-2 at % Cu—Z |  |  | ○ | ○ | ○ |
| 41 | Al-6 at % Cu—Z |  |  | ○ | X | ○ |

It is noted that, in Table 7, the film thickness of the Cu-concentrated layer and the content of Cu in the Cu-concentrated layer were measured after thermal processing for each sample which satisfied the conditions of the present invention. In the result, the film thickness of the each Cu-concentrated layer was within the range of about 0.5 to 2 nm, and the content of Cu in the each Cu-concentrated layer was generally within the range of twice to nine times as much as the average content of Cu in each thin film of Al alloy (not shown in Table 7).

In Table 7, the results of experiments are shown, in which amounts of the third elements selected from the elements belonging to the group X or Z were changed. It was confirmed that similar results of the experiments could be obtained when other elements belonging to the group X or Z and not listed in Table 7 were used as the third elements.

TABLE 8

| No. | Composition | Direct Contact Resistance (10 μm × 10 μm Contact Hall) Contact Resistivity (Ω) | Value |
|---|---|---|---|
| 1 | Al-6 at % Cu | 335 | ◉ |
| 2 | Al-6 at % Cu-0.5 at % La | 285 | ◉ |
| 3 | Al-2 at % Cu | 190 | ○ |
| 4 | Al-2 at % Cu-0.5 at % La | 192 | ○ |
| 5 | Al-2 at % Cu-1.8 at % Mg | 256 | ○ |
| 6 | Al-2 at % Cu-0.8 at % Gd | 222 | ○ |
| 7 | Al-0.1 at % Cu | 215 | ○ |
| 8 | Al-0.1 at % Cu-0.5 at % La | 320 | ○ |

TABLE 9

| No. | Base Alloy | Third Element (X) Type | The Amount Added (at %) | Heat Resisting Property (hillock density) (250° C.) | Electric Resistance (after heating at 250° C. for 30 min) Film Material | Direct Contact Resistance |
|---|---|---|---|---|---|---|
| 1 | Al-2 at % Ge | — | — | X | ○ | ○ |
| 2 | Al-2 at % Ge | Nd | 0.6 | ○ | X | ○ |
| 3 | Al-2 at % Ge—X | Pt | 0.01 | X | ○ | ○ |
| 4 |  | Mg | 1 | ○ | ○ | ○ |
| 5 |  | Cr | 1 | ○ | ○ | ○ |
| 6 |  | Mn | 1 | ○ | ○ | ○ |
| 7 |  | Ru | 1 | ○ | ○ | ○ |
| 8 |  | Rh | 1 | ○ | ○ | ○ |
| 9 |  | Pd | 1 | ○ | ○ | ○ |
| 10 |  | Ir | 1 | ○ | ○ | ○ |
| 11 |  | Pt | 1 | ○ | ○ | ○ |
| 12 |  | Gd | 1 | ○ | ○ | ○ |

TABLE 9-continued

| No. | Base Alloy | Third Element (X) Type | The Amount Added (at %) | Heat Resisting Property (hillock density) (250° C.) | Electric Resistance (after heating at 250° C. for 30 min) Film Material | Direct Contact Resistance |
|---|---|---|---|---|---|---|
| 13 | | Tb | 1 | ○ | ○ | ○ |
| 14 | | Dy | 1 | ○ | ○ | ○ |
| 15 | | Ce | 1 | ○ | ○ | ○ |
| 16 | | Sm | 1 | ○ | ○ | ○ |
| 17 | | Eu | 1 | ○ | ○ | ○ |
| 18 | | Er | 1 | ○ | ○ | ○ |
| 19 | | Pt | 2 | ○ | X | ○ |
| 20 | | Ir | 2.5 | ○ | X | ○ |
| 21 | Al-2 at % Ge—Z | W | 0.01 | X | ○ | ○ |
| 22 | | Ti | 0.5 | ○ | ○ | ○ |
| 23 | | V | 0.5 | ○ | ○ | ○ |
| 24 | | Zr | 0.5 | ○ | ○ | ○ |
| 25 | | Nb | 0.5 | ○ | ○ | ○ |
| 26 | | Mo | 0.5 | ○ | ○ | ○ |
| 27 | | Hf | 0.5 | ○ | ○ | ○ |
| 28 | | W | 0.5 | ○ | ○ | ○ |
| 29 | | Nb | 2.5 | ○ | X | ○ |
| 30 | | Ta | 1.5 | ○ | X | ○ |
| 31 | Al-2 at % Ge | Sn | 1 | X | ○ | ○ |
| 32 | Al-0.05 at % Ge—X | La | 1 | ○ | ○ | X |
| 33 | Al-0.1 at % Ge—X | | | ○ | ○ | ○ |
| 34 | Al-1 at % Ge—X | | | ○ | ○ | ○ |
| 35 | Al-2 at % Ge—X | | | ○ | ○ | ○ |
| 36 | Al-6 at % Ge—X | | | ○ | X | ○ |
| 37 | Al-0.05 at % Ge—Z | Ta | 0.5 | ○ | ○ | X |
| 38 | Al-0.1 at % Ge—Z | | | ○ | ○ | ○ |
| 39 | Al-1 at % Ge—Z | | | ○ | ○ | ○ |
| 40 | Al-2 at % Ge—Z | | | ○ | ○ | ○ |
| 41 | Al-6 at % Ge—Z | | | ○ | X | ○ |

It is noted that, in Table 9, the film thickness of the Ge-concentrated layer and the content of Ge in the Ge-concentrated layer were measured after thermal processing for each sample which satisfied the conditions of the present invention. In the result, the film thickness of the each Ge-concentrated layer was within the range of about 0.5 to 2 nm, and the content of Ge in the each Ge-concentrated layer was generally within the range of twice to nine times as much as the average content of Ge in each thin film of Al alloy (not shown in Table 9).

In Table 9, the results of experiments are shown, in which amounts of the third elements selected from the elements belonging to the group X or Z were changed. It was confirmed that similar results of the experiments could be obtained when other elements belonging to the group X or Z and not listed in Table 9 were used as the third elements.

TABLE 10

| | | Direct Contact Resistance (10 μm × 10 μm Contact Hall) | |
|---|---|---|---|
| No. | Composition | Contact Resistivity (Ω) | Value |
| 1 | Al-6 at % Ge | 23 | ⊚ |
| 2 | Al-6 at % Ge-0.5 at % La | 44 | ⊚ |
| 3 | Al-2 at % Ge | 150 | ⊚ |
| 4 | Al-2 at % Ge-0.5 at % La | 123 | ⊚ |
| 5 | Al-0.1 at % Ge | 335 | ○ |
| 6 | Al-0.1 at % Ge-0.5 at % La | 285 | ○ |

According to the experimental results shown in Tables 1 through 10, it is possible to suppress the electrical resistance of an Al alloy film itself and the contact resistance with pixel electrodes at low levels while securing a sufficient heat resisting property at a relatively low heating temperature such as 250 degrees Celsius. And therefore, it is possible to use a material which has heretofore been impossible to use due to its insufficient heat resisting property as the material of the display device and thus provide richer offerings of material choices.

Example 2

In this example, as described hereinafter, resistance against an alkaline solution using TMAH developing solution and presence or absence of a pitting corrosion were investigated about each sample of an Al alloy thin films having various alloy compositions listed in Tables 11 through 15.

In particular, Al alloy films were formed on glass substrates under the conditions described in 3) of above-described Example 1. Each of the Al alloy films obtained by the above step was directly immersed at 25 degrees Celsius in ordinary developing solutions (solutions containing 2.38 mass % TMAH), the time until the films got completely dissolved was measured, the etching rates per unit time (one minute) were calculated from thus measured time and the amounts of adhering films, and the resistance against an alkaline solution was evaluated in accordance with the following criteria. ○: the etching rate slower than 40 nm/min, Δ: the etching rate of 40 nm/min or faster but slower than 70 nm/min, x: the etching rate of 70 nm/min or faster.

The presence or absence of pitting corrosions was investigated by a surface observation under the optical microscope (magnification: 400×), and was confirmed by an observation with SEM (magnification: 3000×). In the result, those having no foreign particles (pitting corrosions) were determined as "absence" but those having foreign particles (pitting corrosions) were determined as "presence".

For comparison, the etching rate, the resistance against alkaline developing solution, and the presence or absence of pitting corrosions were investigated for a pure Aluminum thin film instead of the Al alloy thin film.

Tables 11 through 15 shows the results.

TABLE 11

| No. | Composition | Etching Rate in Developing Solution (nm/min) | Resistance against Alkaline Developing Solution | Pitting Corrosion |
|---|---|---|---|---|
| 1 | Al-6 at % Ni | 80 | X | absence |
| 2 | Al-2 at % Ni | 120 | X | absence |
| 3 | Al-0.5 at % Ni | 105 | X | absence |
| 4 | Al-2 at % Ni-0.6 at % Nd | 61 | Δ | absence |
| 5 | Al-2 at % Ni-0.2 at % Nd | 90 | X | absence |
| 6 | Al-2 at % Ni-0.6 at % Mn | 40 | ○ | absence |
| 7 | Al-2 at % Ni-0.5 at % La | 29 | ○ | absence |
| 8 | Al-2 at % Ni-0.3 at % V | 24 | ○ | absence |
| 9 | Al-2 at % Ni-1.8 at % Mg | 10 | ○ | absence |
| 10 | Al-2 at % Ni-0.08 at % Mg | 110 | X | absence |
| 11 | Al-2 at % Ni-0.8 at % Gd | 7 | ○ | absence |
| 12 | Al-2 at % Ni-1 at % Dy | 38 | ○ | absence |
| 13 | Al-2 at % Ni-1 at % Tb | 40 | ○ | absence |
| 14 | Al-2 at % Ni-0.5 at % Pt | 120 | X | absence |
| 15 | Al-0.1 at % Ni-0.6 at % Mn | 26 | ○ | absence |
| 16 | Al-0.1 at % Ni-0.5 at % La | 18 | ○ | absence |
| 17 | Al-0.1 at % Ni-0.3 at % V | 16 | ○ | absence |
| 18 | Al-0.1 at % Ni-1.8 at % Mg | 7 | ○ | absence |
| 19 | Al-0.1 at % Ni-0.8 at % Gd | 5 | ○ | absence |
| 20 | Al-6 at % Ni-0.6 at % Mn | 32 | ○ | absence |
| 21 | Al-6 at % Ni-0.5 at % La | 24 | ○ | absence |
| 22 | Al-6 at % Ni-0.3 at % V | 20 | ○ | absence |
| 23 | Al-6 at % Ni-1.8 at % Mg | 8 | ○ | absence |
| 24 | Al-6 at % Ni-0.8 at % Gd | 6 | ○ | absence |
| 25 | Al-2 at % Ni-0.5 at % Ta | 40 | ○ | absence |
| 26 | Al-2 at % Ni-0.5 at % Sm | 39 | ○ | absence |
| 27 | Al-2 at % Ni-0.5 at % Eu | 40 | ○ | absence |
| 28 | Al-2 at % Ni-0.5 at % Er | 40 | ○ | absence |
| 29 | Al | 20 | ○ | absence |

TABLE 12

| No. | Composition | Etching Rate in Developing Solution (nm/min) | Resistance against Alkaline Developing Solution | Pitting Corrosion |
|---|---|---|---|---|
| 1 | Al-6 at % Ag | 55 | X | presence |
| 2 | Al-2 at % Ag | 42 | X | presence |
| 3 | Al-0.5 at % Ag | 40 | X | presence |
| 4 | Al-2 at % Ag-0.6 at % Nd | 48 | Δ | absence |
| 5 | Al-2 at % Ag-0.2 at % Nd | 50 | X | presence |
| 6 | Al-2 at % Ag-0.6 at % Mn | 39 | ○ | absence |
| 7 | Al-2 at % Ag-0.5 at % La | 35 | ○ | absence |
| 8 | Al-2 at % Ag-0.3 at % V | 30 | ○ | absence |
| 9 | Al-2 at % Ag-1.8 at % Mg | 22 | ○ | absence |
| 10 | Al-2 at % Ag-0.08 at % Mg | 42 | X | presence |
| 11 | Al-2 at % Ag-0.8 at % Gd | 9 | ○ | absence |
| 12 | Al-2 at % Ag-1 at % Dy | 32 | ○ | absence |
| 13 | Al-2 at % Ag-1 at % Tb | 32 | ○ | absence |
| 14 | Al-2 at % Ag-0.5 at % Pt | 75 | X | presence |
| 15 | Al-0.1 at % Ag-0.6 at % Mn | 12 | ○ | absence |
| 16 | Al-0.1 at % Ag-0.5 at % La | 7 | ○ | absence |
| 17 | Al-0.1 at % Ag-0.3 at % V | 10 | ○ | absence |
| 18 | Al-0.1 at % Ag-1.8 at % Mg | 10 | ○ | absence |
| 19 | Al-0.1 at % Ag-0.8 at % Gd | 5 | ○ | absence |
| 20 | Al-6 at % Ag-0.6 at % Mn | 39 | ○ | absence |
| 21 | Al-6 at % Ag-0.5 at % La | 34 | ○ | absence |
| 22 | Al-6 at % Ag-0.3 at % V | 30 | ○ | absence |
| 23 | Al-6 at % Ag-1.8 at % Mg | 22 | ○ | absence |
| 24 | Al-6 at % Ag-0.8 at % Gd | 14 | ○ | absence |
| 25 | Al-2 at % Ag-0.5 at % Ta | 35 | ○ | absence |
| 26 | Al-2 at % Ag-0.5 at % Sm | 40 | ○ | absence |
| 27 | Al-2 at % Ag-0.5 at % Eu | 35 | ○ | absence |
| 28 | Al-2 at % Ag-0.5 at % Er | 37 | ○ | absence |

TABLE 13

| No. | Composition | Etching Rate in Developing Solution (nm/min) | Resistance against Alkaline Developing Solution | Pitting Corrosion |
|---|---|---|---|---|
| 1 | Al-6 at % Zn | 40 | X | presence |
| 2 | Al-2 at % Zn | 30 | X | presence |
| 3 | Al-0.5 at % Zn | 28 | X | presence |
| 4 | Al-2 at % Zn-0.6 at % Nd | 15 | Δ | absence |
| 5 | Al-2 at % Zn-0.2 at % Nd | 25 | X | presence |
| 6 | Al-2 at % Zn-0.6 at % Mn | 20 | ○ | absence |
| 7 | Al-2 at % Zn-0.5 at % La | 15 | ○ | absence |
| 8 | Al-2 at % Zn-0.3 at % V | 25 | ○ | absence |
| 9 | Al-2 at % Zn-1.8 at % Mg | 16 | ○ | absence |
| 10 | Al-2 at % Zn-0.08 at % Mg | 33 | X | presence |
| 11 | Al-2 at % Zn-0.8 at % Gd | 8 | ○ | absence |
| 12 | Al-2 at % Zn-1 at % Dy | 28 | ○ | absence |
| 13 | Al-2 at % Zn-1 at % Tb | 25 | ○ | absence |
| 14 | Al-2 at % Zn-0.5 at % Pt | 65 | X | presence |
| 15 | Al-0.1 at % Zn-0.6 at % Mn | 17 | ○ | absence |
| 16 | Al-0.1 at % Zn-0.5 at % La | 10 | ○ | absence |
| 17 | Al-0.1 at % Zn-0.3 at % V | 12 | ○ | absence |
| 18 | Al-0.1 at % Zn-1.8 at % Mg | 3 | ○ | absence |
| 19 | Al-0.1 at % Zn-0.8 at % Gd | 4 | ○ | absence |
| 20 | Al-6 at % Zn-0.6 at % Mn | 31 | ○ | absence |
| 21 | Al-6 at % Zn-0.5 at % La | 25 | ○ | absence |
| 22 | Al-6 at % Zn-0.3 at % V | 28 | ○ | absence |
| 23 | Al-6 at % Zn-1.8 at % Mg | 20 | ○ | absence |
| 24 | Al-6 at % Zn-0.8 at % Gd | 10 | ○ | absence |
| 25 | Al-2 at % Zn-0.5 at % Ta | 25 | ○ | absence |
| 26 | Al-2 at % Zn-0.5 at % Sm | 25 | ○ | absence |
| 27 | Al-2 at % Zn-0.5 at % Eu | 30 | ○ | absence |
| 28 | Al-2 at % Zn-0.5 at % Er | 28 | ○ | absence |

TABLE 14

| No. | Composition | Etching Rate in Developing Solution (nm/min) | Resistance against Alkaline Developing Solution | Pitting Corrosion |
|---|---|---|---|---|
| 1 | Al-6 at % Ge | 33 | X | presence |
| 2 | Al-2 at % Ge | 25 | X | presence |
| 3 | Al-0.5 at % Ge | 25 | X | presence |
| 4 | Al-2 at % Ge-0.6 at % Nd | 9 | Δ | absence |
| 5 | Al-2 at % Ge-0.2 at % Nd | 21 | X | presence |
| 6 | Al-2 at % Ge-0.6 at % Mn | 15 | ○ | absence |
| 7 | Al-2 at % Ge-0.5 at % La | 18 | ○ | absence |
| 8 | Al-2 at % Ge-0.3 at % V | 22 | ○ | absence |
| 9 | Al-2 at % Ge-1.8 at % Mg | 11 | ○ | absence |
| 10 | Al-2 at % Ge-0.08 at % Mg | 28 | X | presence |
| 11 | Al-2 at % Ge-0.8 at % Gd | 9 | ○ | absence |
| 12 | Al-2 at % Ge-1 at % Dy | 20 | ○ | absence |
| 13 | Al-2 at % Ge-1 at % Tb | 40 | ○ | absence |
| 14 | Al-2 at % Ge-0.5 at % Pt | 63 | X | presence |
| 15 | Al-0.1 at % Ge-0.6 at % Mn | 13 | ○ | absence |
| 16 | Al-0.1 at % Ge-0.5 at % La | 14 | ○ | absence |
| 17 | Al-0.1 at % Ge-0.3 at % V | 18 | ○ | absence |
| 18 | Al-0.1 at % Ge-1.8 at % Mg | 13 | ○ | absence |
| 19 | Al-0.1 at % Ge-0.8 at % Gd | 5 | ○ | absence |
| 20 | Al-6 at % Ge-0.6 at % Mn | 32 | ○ | absence |
| 21 | Al-6 at % Ge-0.5 at % La | 30 | ○ | absence |
| 22 | Al-6 at % Ge-0.3 at % V | 31 | ○ | absence |
| 23 | Al-6 at % Ge-1.8 at % Mg | 25 | ○ | absence |
| 24 | Al-6 at % Ge-0.8 at % Gd | 19 | ○ | absence |
| 25 | Al-2 at % Ge-0.5 at % Ta | 22 | ○ | absence |
| 26 | Al-2 at % Ge-0.5 at % Sm | 21 | ○ | absence |
| 27 | Al-2 at % Ge-0.5 at % Eu | 33 | ○ | absence |
| 28 | Al-2 at % Ge-0.5 at % Er | 32 | ○ | absence |

TABLE 15

| No. | Composition | Etching Rate in Developing Solution (nm/min) | Resistance against Alkaline Developing Solution | Pitting Corrosion |
|---|---|---|---|---|
| 1 | Al-6 at % Cu | 58 | X | presence |
| 2 | Al-2 at % Cu | 48 | X | presence |
| 3 | Al-0.5 at % Cu | 48 | X | presence |
| 4 | Al-2 at % Cu-0.6 at % Nd | 43 | Δ | absence |
| 5 | Al-2 at % Cu-0.2 at % Nd | 48 | X | presence |
| 6 | Al-2 at % Cu-0.6 at % Mn | 40 | ○ | absence |
| 7 | Al-2 at % Cu-0.5 at % La | 31 | ○ | absence |
| 8 | Al-2 at % Cu-0.3 at % V | 22 | ○ | absence |
| 9 | Al-2 at % Cu-1.8 at % Mg | 15 | ○ | absence |
| 10 | Al-2 at % Cu-0.08 at % Mg | 42 | X | presence |
| 11 | Al-2 at % Cu-0.8 at % Gd | 12 | ○ | absence |
| 12 | Al-2 at % Cu-1 at % Dy | 33 | ○ | absence |
| 13 | Al-2 at % Cu-1 at % Tb | 38 | ○ | absence |
| 14 | Al-2 at % Cu-0.5 at % Pt | 85 | X | presence |
| 15 | Al-0.1 at % Cu-0.6 at % Mn | 20 | ○ | absence |
| 16 | Al-0.1 at % Cu-0.5 at % La | 12 | ○ | absence |
| 17 | Al-0.1 at % Cu-0.3 at % V | 16 | ○ | absence |
| 18 | Al-0.1 at % Cu-1.8 at % Mg | 10 | ○ | absence |
| 19 | Al-0.1 at % Cu-0.8 at % Gd | 10 | ○ | absence |
| 20 | Al-6 at % Cu-0.6 at % Mn | 40 | ○ | absence |
| 21 | Al-6 at % Cu-0.5 at % La | 30 | ○ | absence |
| 22 | Al-6 at % Cu-0.3 at % V | 35 | ○ | absence |
| 23 | Al-6 at % Cu-1.8 at % Mg | 25 | ○ | absence |
| 24 | Al-6 at % Cu-0.8 at % Gd | 22 | ○ | absence |
| 25 | Al-2 at % Cu-0.5 at % Ta | 40 | ○ | absence |
| 26 | Al-2 at % Cu-0.5 at % Sm | 27 | ○ | absence |
| 27 | Al-2 at % Cu-0.5 at % Eu | 26 | ○ | absence |
| 28 | Al-2 at % Cu-0.5 at % Er | 38 | ○ | absence |

What is claimed is:

1. A display device in which an Al alloy film and a conductive oxide film are directly connected without interposition of refractory metal,
    wherein the Al alloy film comprises 0.1 to 6 at % of at least one element selected from the group consisting of Ni, Ag, Zn, Cu, and Ge, 0.1 to 2 at % of Mg, and at least one element selected from the group consisting of Cr, Mn, Ru, Rh, Pd, Ir, Pt, La, Ce, Pr, Gd, Tb, Sm, Eu, Ho, Er, Tm, Yb, Lu, and Dy as alloy components, and
    wherein the at least one element selected from the group consisting of Ni, Ag, Zn, Cu, and Ge are concentrated at an interface of contact between the Al alloy film and the conductive oxide film in a layer having a thickness of from 1 to 5 nm.

2. A display device in which an Al alloy film and a conductive oxide film are directly connected without interposition of refractory metal,
    wherein the Al alloy film comprises 0.1 to 6 at % of at least one element selected from the group consisting of Ni, Ag, Zn, Cu, and Ge, 0.1 to 1 at % of Ti, and at least one element selected from the group consisting of V, Zr, Nb, Mo, Hf, Ta, and W as alloy components, and
    wherein the at least one element selected from the group consisting of Ni, Ag, Zn, Cu, and Ge are concentrated at an interface of contact between the Al alloy film and the conductive oxide film in a layer having a thickness of from 1 to 5 nm.

3. The display device according to claim 1, wherein the electrical resistivity of the Al alloy film is 7 μΩ·cm or less after heat treatment at 250 degrees Celsius for 30 minutes.

4. The display device according to claim 2, wherein the electrical resistivity of the Al alloy film is 7 μΩ·cm or less after heat treatment at 250 degrees Celsius for 30 minutes.

5. The display device according to claim 1, wherein the Al alloy film comprises 0.3 to 1.8 at % of the at least one element selected from the group consisting of Cr, Mn, Ru, Rh, Pd, Ir, Pt, La, Ce, Pr, Gd, Tb, Sm, Eu, Ho, Er, Tm, Yb, Lu, and Dy.

6. The display device according to claim 2, wherein the Al alloy film comprises 0.2 to 0.8 at % of the at least one element selected from the group consisting of V, Zr, Nb, Mo, Hf, Ta, and W.

7. The display device according to claim 1, wherein the Al alloy film comprises 0.2 to 5.0 at % of the at least one element selected from the group consisting of Ni, Ag, Zn, Cu, and Ge.

8. The display device according to claim 2, wherein the Al alloy film comprises 0.2 to 5.0 at % of the at least one element selected from the group consisting of Ni, Ag, Zn, Cu, and Ge.

9. The display device according to claim 1, wherein the at least one element selected from the group consisting of Ni, Ag, Zn, Cu, and Ge concentration in said layer is 2.5 times or more the average concentration in the Al alloy film.

10. The display device according to claim 1, wherein the at least one element selected from the group consisting of Ni, Ag, Zn, Cu, and Ge concentration in said layer is 2.5 times or more the average concentration in the Al alloy film.

11. The display device according to claim 1, wherein the electrical resistivity of the Al alloy film is 5 μΩ·cm or less after heat treatment at 250 degrees Celsius for 30 minutes.

12. The display device according to claim 2, wherein the electrical resistivity of the Al alloy film is 5 μΩ·cm or less after heat treatment at 250 degrees Celsius for 30 minutes.

* * * * *